United States Patent
Krak et al.

(10) Patent No.: US 7,626,185 B2
(45) Date of Patent: Dec. 1, 2009

(54) PATTERNING COMPOSITIONS, MASKS, AND METHODS

(75) Inventors: Stephen J. Krak, Newark, OH (US); Joel D Elhard, Hilliard, OH (US); Eric L Hogue, Galloway, OH (US); Timothy J Stanfield, Lewis Center, OH (US); Richard P Heggs, Dublin, OH (US)

(73) Assignee: Battelle Memorial Institute, Columbus, OH (US)

( * ) Notice: Subject to any disclaimer, the term of this patent is extended or adjusted under 35 U.S.C. 154(b) by 169 days.

(21) Appl. No.: 11/836,481

(22) Filed: Aug. 9, 2007

(65) Prior Publication Data
US 2008/0135784 A1    Jun. 12, 2008

Related U.S. Application Data

(60) Provisional application No. 60/822,134, filed on Aug. 11, 2006, provisional application No. 60/822,216, filed on Aug. 11, 2006.

(51) Int. Cl.
G03F 9/00 (2006.01)
G03F 1/00 (2006.01)
G21K 5/10 (2006.01)

(52) U.S. Cl. ............... 250/492.22; 250/492.2; 430/5; 430/270.1; 716/21

(58) Field of Classification Search ............ 250/492.22, 250/492.2; 430/5, 270.1; 716/21
See application file for complete search history.

(56) References Cited

U.S. PATENT DOCUMENTS

| | | | |
|---|---|---|---|
| 3,867,150 A | 2/1975 | Ketley | |
| 4,388,388 A | 6/1983 | Kornbau et al. | |
| 5,344,729 A | 9/1994 | Akins et al. | |
| 5,905,007 A | 5/1999 | Ho et al. | |
| 5,994,026 A | 11/1999 | DeBoer et al. | |
| 5,998,569 A | 12/1999 | Hogan et al. | |
| 6,091,879 A | 7/2000 | Chan et al. | |
| 6,383,690 B1 | 5/2002 | Vargas | |

(Continued)

FOREIGN PATENT DOCUMENTS

DE    3342579 A1    5/1984

(Continued)

OTHER PUBLICATIONS

Bride et al., J. A., Photolithographic Micromolding of Ceramics Using Plasma Etched Polyimide Patterns, Appl. Phys. Lett., vol. 63, No. 24, Dec. 13, 1993, 3379-3381.

(Continued)

*Primary Examiner*—Nikita Wells
(74) *Attorney, Agent, or Firm*—Barry S. Bissell

(57) ABSTRACT

Electromagnetic radiation sensitive mask materials are provided. The mask materials are chosen such a first percentage of electromagnetic radiation at a first wavelength is transmitted through the mask material prior to the exposure of the mask material to electromagnetic radiation at a second wavelength and a second percentage of electromagnetic radiation at the first wavelength is transmitted through at least a portion of the mask material after the at least a portion of the mask material is exposed to electromagnetic radiation at the second wavelength. Methods of patterning substrates using electromagnetic radiation sensitive mask materials are also provided. Compositions for producing masks are provided, and systems are provided.

54 Claims, 42 Drawing Sheets

U.S. PATENT DOCUMENTS

| | | | |
|---|---|---|---|
| 6,416,908 B1 | 7/2002 | Klosner et al. | |
| 6,630,308 B2 * | 10/2003 | Stryer et al. | 506/9 |
| 6,844,131 B2 | 1/2005 | Oberlander et al. | |
| 6,864,375 B2 | 3/2005 | Huang et al. | |
| 2003/0207747 A1 | 11/2003 | Wu et al. | |
| 2004/0121268 A1 | 6/2004 | Conroy et al. | |
| 2004/0122233 A1 | 6/2004 | Beck et al. | |
| 2004/0175656 A1 | 9/2004 | Baer et al. | |
| 2005/0079529 A1 * | 4/2005 | Fodor et al. | 435/6 |
| 2005/0164121 A1 * | 7/2005 | Anzures et al. | 430/270.1 |
| 2006/0033088 A1 | 2/2006 | Kim et al. | |
| 2006/0046156 A1 | 3/2006 | Amako et al. | |
| 2006/0073422 A1 | 4/2006 | Edwards et al. | |

FOREIGN PATENT DOCUMENTS

| | | |
|---|---|---|
| DE | 3541559 A1 | 5/1987 |
| DE | 9420174.9 U1 | 3/1995 |
| DE | 10028790 A1 | 12/2001 |
| EP | 0280197 A2 | 8/1988 |
| EP | 0738930 A2 | 10/1996 |
| JP | 01013544 | 1/1989 |

OTHER PUBLICATIONS

Eisenberg, Anne, Versatile Masks of Dye Speed the Chip-Making Process, The New York Times Company, p. 1-4.

French et al., Roger H., Novel Hydrofluorocarbon Polymers for use as Pellicles in 157 nm Semiconductor Photolithography: Fundamentals of Transparency, Journal of Fluorine Chemistry 122 (2003) 63-80, Elsevier Science.

Lin, B. J., Deep-UV Conformable-Contract Photolithography for Bubble Circuits, Conformable Masks, May 1976, 213-221.

Mendoza et al., E. A., Continuous Tone Gray-Scale Photomasks Based on Photosensitive Spin-On-Glass Technology for Deep UV Lithography Applications, Proceedings of SPIE vol. 5256 23rd Annual BACUS Symposium on Photomask Technology, 2003.

Paul et al., Kateri E., Patterning Spherical Surfaces at the Two-Hundred-Nanometer Scale Using Soft Lithography, Advanced Fuctional Materials, 2003, 13, No. 4, 259-263.

Rogers et al., John A., Using an Elastomeric Phase for Sub-100 nm Photolithography in the Optical Near Field, Applied Physics Letters, May 19, 1997, vol. 70, Issue 20, pp. 2658-2660.

Kunz et al., R. R., Large-Area Patterning of ~50 nm Structures on Flexible Substrates Using Near-Field 193 nm Radiation, J. Vac. Sci. Technol. B 21(1), Jan./Feb. 2003, American Vacuum Society, 78-81.

PCT International Search Report and Written Opinion, Application No. PCT/US2007/075573, Filing Date Sep. 8, 2007, Battelle Memorial Institute.

Duffy et al., David C., Patterning Electroluminescent Materials with Feature Sizes as Small as 5um Using Elastomeric Membranes as Masks for Dry-Off**, Advanced Materials, 1999, 11, No. 7.

* cited by examiner

Generic Triarylmethane Leuco Dye Structure:

X = H; $R_1, R_2, R_3$ = -$NH_2$, -$NR_2$, -OH

Generic Fluoran Leuco Dye Structure:
R1,R2,R3,R4: -H, -Ar, -$CH_3$; C2-Cn;
R5 = -H, -$CH_3$, C2-Cn Colored "Zwitterion" Form Colorless "Leuco" Form

- Urethane, Urea, Carbamates $\xrightarrow{h\nu}$

Quinone-imide and Diquinone-imide

Mask Generation Film Spectra for Thermoplastic Elastomer (TPE) containing Electromagnetic Radiation Sensitive Fluoran Leuco Dye with Photoacid Generator (1.0% Black XV; 1.0% PAG 203 in SEBS Kraton G1652, ~8mils thick)
Exposure: Hg/Xe: 320-500nm filter at ~100mW/cm$^2$ Ciba Irgacure PAG 203

Ciba PAG : CGI 725

PATTERNING COMPOSITIONS, MASKS, AND METHODS

CROSS REFERENCE TO RELATED APPLICATIONS

This application claims priority to and any other benefit of U.S. Provisional Application Ser. No. 60/822,134, filed Aug. 11, 2006, the entirety of which is incorporated by reference herein. This application is related to the application entitled PATTERNING NON-PLANAR SURFACES, U.S. Provisional Application Ser. No. 60/822,216, filed Aug. 11, 2006, the entirety of which is incorporated herein.

BACKGROUND

Patterning methods and applications have become increasingly complex. For example, it may be desirable to pattern complex surfaces using patterning processes. Such complex surfaces include, but are not limited to, curved radomes that house instruments and provide frequency selective surfaces on moving vehicles or land based installations and three-dimensional printed circuit boards. These complex surfaces present special difficulties because complex shaped masks are difficult to fabricate. Additionally, such masks can be expensive, difficult to use and/or reuse, and prone to patterning errors. For example, rigid shells having patterns of electromagnetic radiation blocking material and formed in the complex shape of the part have been used. However, this rigid shell can be expensive and difficult to fabricate. Additionally, this rigid shell may introduce patterning errors if good contact is not established between the shell and the surface to be patterned. Thus, there remains a need in the art for additional methods, compositions, and masks for use in patterning surfaces.

SUMMARY

In various embodiments of the invention, masks are provided. The masks can comprise an electromagnetic radiation sensitive mask material. The electromagnetic radiation sensitive mask material can be selected such that a first percentage of electromagnetic radiation at a first wavelength is transmitted through the electromagnetic radiation sensitive mask material prior to the exposure of the electromagnetic radiation sensitive mask material to electromagnetic radiation at a second wavelength; a second percentage of electromagnetic radiation at the first wavelength is transmitted through at least a portion of the electromagnetic radiation sensitive mask material after the at least a portion of the electromagnetic radiation sensitive mask material is exposed to electromagnetic radiation at the second wavelength; and the electromagnetic radiation sensitive mask material is suitable to define features on a substrate at the first wavelength after the exposure of the at least a portion of the electromagnetic radiation sensitive mask material to electromagnetic radiation at the second wavelength to form patterns defining the features in the electromagnetic radiation sensitive mask material.

In various additional embodiments, methods are provided. The methods can comprise exposing at least one selected portion of a mask comprising an electromagnetic radiation sensitive mask material having at least one electromagnetic radiation sensitive portion to electromagnetic radiation at a patterning wavelength to cause a reaction of the at least one electromagnetic radiation sensitive portion such that a pattern is formed in the mask; and subsequently exposing a substrate to electromagnetic radiation at an exposure wavelength through the mask such that the pattern is formed on the substrate, wherein the substrate is sensitive to electromagnetic radiation at the exposure wavelength.

In yet other various embodiments, compositions for producing masks are provided. The compositions can comprise a polymer and at least one electromagnetic radiation sensitive additive. Upon processing of the polymer, an electromagnetic radiation sensitive mask material is formed. The electromagnetic radiation sensitive mask material transmits a smaller percentage of electromagnetic radiation at a first wavelength after exposure of the electromagnetic radiation sensitive mask material to electromagnetic radiation at a second wavelength than the electromagnetic radiation sensitive mask material transmits at the first wavelength prior to exposure of the electromagnetic radiation sensitive additive to electromagnetic radiation at the second wavelength.

In other various embodiments, compositions for producing a masks are provided. The compositions can comprise at least one electromagnetic sensitive polymer and at least one acid sensitive additive. Upon processing of the polymer, an electromagnetic radiation sensitive mask material is formed. The electromagnetic radiation sensitive mask material transmits a smaller percentage of electromagnetic radiation at a first wavelength after exposure of the electromagnetic radiation sensitive mask material to electromagnetic radiation at a second wavelength than the electromagnetic radiation sensitive mask material transmits at the first wavelength prior to exposure of the electromagnetic radiation sensitive compound to electromagnetic radiation at the second wavelength.

In yet further various embodiments, systems are provided. The systems can comprise a source for a first and a second electromagnetic radiation, a mask sensitive to the second electromagnetic radiation, a substrate sensitive to the first electromagnetic radiation, and a device in conjunction with the source for the first and second electromagnetic radiations. The device is capable of exposing the mask to the second electromagnetic radiation such that regions that are selectively opaque to the first electromagnetic radiation are formed in the mask, and the device is capable of subsequently exposing the substrate to the first electromagnetic radiation through the selectively opaque mask such that portions of the substrate are selectively exposed to the first electromagnetic radiation.

It will be understood that the various embodiments described above are exemplary embodiments only, and that this invention may, however, be embodied in different forms and should not be construed as limited to the embodiments set forth herein.

BRIEF DESCRIPTION OF THE SEVERAL VIEWS OF THE DRAWINGS

The following detailed description of embodiments of the present invention can be best understood when read in conjunction with the following drawings, where like structure is indicated with like reference numerals and in which.

DETAILED DESCRIPTION OF EMBODIMENTS OF THE INVENTION

Figure 1:
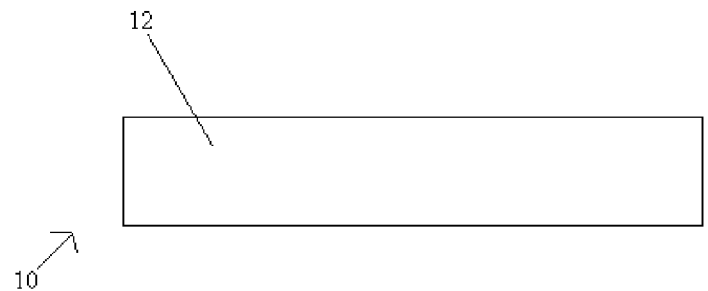
FIG. 1 is a side view of a mask in accordance with various embodiments of the invention.

The present invention will now be described with occasional reference to the specific embodiments of the invention. This invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all technical and scientific terms used herein have the same meaning as commonly understood by one of ordinary skill in the art to which this invention belongs. The terminology used in the description of the invention herein is for describing particular embodiments only and is not intended to be limiting of the invention. As used in the description of the invention and the appended claims, the singular forms "a," "an," and "the" are intended to include the plural forms as well, unless the context clearly indicates otherwise. All publications, patent applications, patents, and other references mentioned herein are incorporated by reference in their entirety.

Unless otherwise indicated, all numbers expressing quantities, properties, and so forth as used in the specification and claims are to be understood as being modified in all instances by the term "about." Accordingly, unless otherwise indicated, the numerical properties set forth in the following specification and claims are approximations that may vary depending on the desired properties sought to be obtained in embodiments of the present invention. Notwithstanding that the numerical ranges and parameters setting forth the broad scope of the invention are approximations, the numerical values to the extent that such are set forth in the specific examples are reported as precisely as possible. Any numerical values, however, inherently contain certain errors necessarily resulting from error found in their respective measurements.

Except as otherwise specifically defined herein, all terms used herein have the same meaning as commonly understood by one of ordinary skill in the art to which this invention belongs. The terminology used in the description of the invention herein is for describing particular embodiments only, and is not intended to be limiting of the invention. As used in the description of the invention and the appended claims, the singular forms "a," "an," and "the" are intended to include the plural forms as well, unless the context clearly indicates otherwise.

Unless otherwise indicated, all numbers expressing quantities, properties, and so forth as used in the specification and claims are to be understood as being modified in all instances by the term "about." Accordingly, unless otherwise indicated, the numerical properties set forth in the following specification and claims are approximations that may vary depending on the desired properties sought to be obtained in embodiments of the present invention. Notwithstanding that the numerical ranges and parameters setting forth the broad scope of the invention are approximations, the numerical values to the extent that such are set forth in the specific examples are reported as precisely as possible. Any numerical values, however, inherently contain certain errors necessarily resulting from error found in their respective measurements.

A complete understanding of the invention will be obtained from the following description when taken in connection with the accompanying drawing figures wherein like reference characters identify like parts throughout. For purposes of the description hereinafter, the terms "upper", "lower", "right", "left", "vertical", "horizontal", "top", "bottom", "front", "back" and derivatives thereof shall relate to the invention as it is oriented in the drawing figures. However, it is to be understood that the invention may assume various alternative variations, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

The present invention relates to compositions, masks, systems and patterning methods that may be used to produce a variety of patterned substrates. The compositions, masks, systems and patterning methods may be scalable and useful for patterning substrates that have complex shapes.

In accordance with embodiments of the invention, masks are provided. Referring to FIG. 1, a mask 10 is illustrated. The mask 10 comprises a electromagnetic radiation sensitive mask material 12. For purposes of defining and describing the present invention, the term "electromagnetic radiation sensitive mask material" shall be understood as referring to a material that exhibits a change in transmittance in areas exposed to electromagnetic radiation of a desired wavelength and that has a contrast ratio between unexposed areas and exposed areas suitable to pattern the mask material and use the mask material to define features on a substrate sensitive to electromagnetic radiation of a desired wavelength. For purposes of describing and defining this invention, "wavelength" shall be understood as referring to range of wavelengths emitted by a particular electromagnetic radiation source and as delivered through filters, including, but not limited to, high-pass, low-pass, and band-pass, to the material. The electromagnetic radiation sensitive mask material is selected such that a first percentage of electromagnetic radiation at a first wavelength is transmitted through the electromagnetic radiation sensitive mask material prior to the exposure of the electromagnetic radiation sensitive mask material to electromagnetic radiation at a second wavelength. Additionally, the electromagnetic radiation sensitive mask material is selected such that a second percentage of electromagnetic radiation at the first wavelength is transmitted through at least a portion of the electromagnetic radiation sensitive mask material after at least a portion of the electromagnetic radiation sensitive mask material is exposed to electromagnetic radiation at the second wavelength. The electromagnetic radiation sensitive mask material is suitable to define features on a substrate to electromagnetic radiation at the first wavelength after the exposure of the at least a portion of the electromagnetic radiation sensitive mask material to electromagnetic radiation at the second wavelength to form patterns defining the features in the electromagnetic radiation sensitive mask material.

It will be understood that the mask can be used to pattern a substrate sensitive to electromagnetic radiation at a first wavelength in any suitable manner. For example, a substrate having a photoresist that is sensitive to electromagnetic radiation at a first wavelength thereon may be provided. The mask can be used to photolithographically pattern such a substrate. In other examples, the substrate can comprise a electromagnetic radiation sensitive mask material of the present invention. In yet another alternative, the substrate may be provided with a layer in which a change in the surface charge is produced upon exposure to electromagnetic radiation at a first wavelength. A toner and cure can be subsequently provided to fix the features on the substrate. Any other suitable substrate that is electromagnetic radiation sensitive may be used. For example, the masks can be used in photoimaging of the substrate. It will be further understood that the mask itself may be the substrate. For example, a photoresist that is sensitive to electromagnetic radiation at a first wavelength may be provided on at least a portion of the mask, and the resist may be exposed through the mask.

In some examples, the first percentage of electromagnetic radiation may be greater than the second percentage of electromagnetic radiation. In other examples, the first percentage of electromagnetic radiation may be less than the second percentage of electromagnetic radiation. In yet other examples, the second percentage of electromagnetic radiation may be a gradient of electromagnetic radiation. For example, there may be a gradient of percentages of the second electromagnetic radiation from one face of the mask to another face of the mask, and such a mask may be exposed from either side. It will be understood that the relationship between the first percentage and the second percentage of electromagnetic radiation can be controlled by selecting the electromagnetic radiation sensitive mask material as further discussed herein. For example, the electromagnetic radiation sensitive mask material can have a contrast ratio between the area of the electromagnetic radiation sensitive mask material that is not exposed to electromagnetic radiation at the second wavelength and an area of the electromagnetic radiation sensitive mask material that is exposed to electromagnetic radiation at the second wavelength of about 4:1, 5:1, 6:1, 7:1, 8:1, 9:1, 10:1, 12:1, 13:1, 14:1, 15:1, 16:1, 17:1, 18:1, 19:1, 20:1, 21:1, 22:1, 23:1, 24:1 25:1, or up to 100:1 or more. It will be understood that the contrast ratio can be a range of about x to about y, where x and y are selected from the contrast ratios listed above. In general, the contrast ratio will be determined by the sensitivity of the substrate sensitive to electromagnetic radiation of a first wavelength to be patterned with the mask or the level of optical clarity of the mask, or both.

Figure 2:
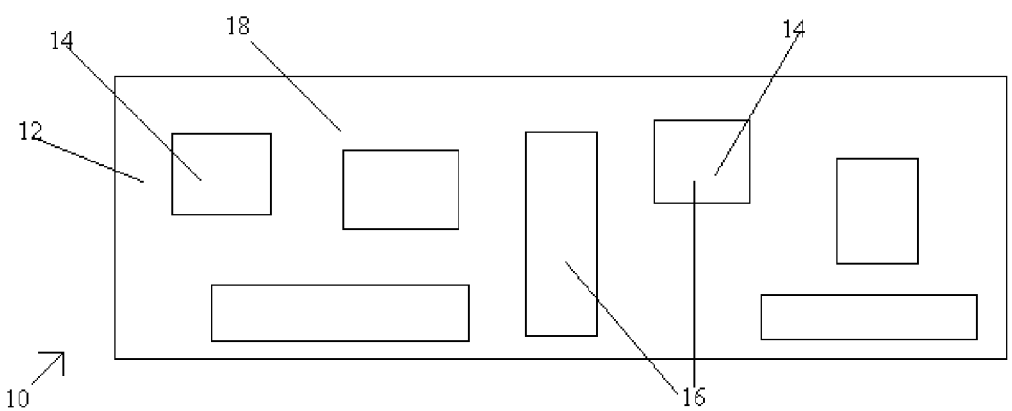
FIG. 2 is a top view of a mask having patterned areas in accordance with various embodiments of the invention.

For example, referring to FIG. 2, the electromagnetic radiation sensitive mask material 12 can have a pattern 14 formed therein upon exposure of the electromagnetic radiation sensitive mask material 12 to electromagnetic radiation at a second wavelength. It will be understood that the pattern 14 is defined by areas 16 of the electromagnetic radiation sensitive mask material 12 that transmit a different percentage of electromagnetic radiation at a first wavelength than areas 18 that have not been exposed to electromagnetic radiation at the second wavelength. It will be further understood that the areas 16 may exhibit a color change that is apparent under visible electromagnetic radiation. Alternatively, the areas 16 may not exhibit any color change under visible electromagnetic radiation. In some examples, some areas 16 may exhibit a color change that is apparent under visible electromagnetic radiation, and other areas 16 may not exhibit any color change under visible electromagnetic radiation.

In some examples, the first wavelength and the second wavelength may be the same wavelength. For example, the electromagnetic radiation sensitive mask material may be exposed to electromagnetic radiation of a first wavelength at a first total exposure energy and the substrate may be subsequently patterned by exposure through the mask to electromagnetic radiation of a first wavelength at a second total exposure energy. For example, the first total exposure energy may be much greater than the second total exposure energy, and the electromagnetic radiation sensitive mask material would transmit a different percentage of electromagnetic radiation only after exposure to the first total exposure energy, because the second total exposure energy may be too small to cause the electromagnetic radiation sensitive mask material to react. In another example, the electromagnetic radiation sensitive mask material may be selected such that the transmissivity of a particular electromagnetic radiation through the mask material is changed only after the absorption of two or more photons. The substrate could be subsequently processed with electromagnetic radiation that does not cause the absorption of two or more photons. For example, the substrate could be exposed to electromagnetic radiation having less total energy than the electromagnetic radiation used to expose the electromagnetic radiation sensitive mask material.

In other examples, the first wavelength and the second wavelength are different. For example, at least a portion of the electromagnetic radiation sensitive mask material may be exposed to electromagnetic radiation in the UV or deep UV range such that the portions of the electromagnetic radiation sensitive mask material that are exposed to this electromagnetic radiation exhibit reduced transmission of electromagnetic radiation in the visible range. In other examples, the electromagnetic radiation sensitive mask material may be exposed to electromagnetic radiation in the visible or x-ray range. It will be understood that the electromagnetic radiation sensitive mask material can be selected to perform as desired at desired first and second wavelengths.

The mask may be of any suitable dimensions and thickness. For example, the mask may be from less than about two inches in diameter to greater than about ten feet in diameter. In some examples, the mask may be from about 1 μm to about 200 μm thick. In yet other examples, the mask may be from about 0.025 mm to about 1 mm thick. It will be understood that the particular dimensions and thickness of the mask may be selected or controlled with the selection of appropriate electromagnetic radiation sensitive mask materials.

The electromagnetic radiation sensitive mask material can comprise any suitable electromagnetic radiation sensitive material. In some embodiments, the electromagnetic radiation sensitive mask material comprises an electromagnetic radiation transparent material having at least one electromagnetic radiation sensitive additive. The electromagnetic radiation transparent material can be any suitable material allows an effective amount of electromagnetic radiation through the material. Compositions for producing the electromagnetic radiation sensitive mask material are additionally provided. These compositions comprise at least one polymer, at least one electromagnetic radiation sensitive additive, acid sensitive additive, or both. The compositions comprise at least one electromagnetic sensitive portion. Upon processing of the polymer, an electromagnetic radiation sensitive mask material is formed. It will be understood that the processing of the polymer can comprise processing a polymer having at least one electromagnetic radiation sensitive additive, acid sensitive additive, or both dispersed therein such that a polymer matrix is formed having the at least one electromagnetic radiation sensitive additive, acid sensitive additive, or both dispersed in the matrix. In other examples, processing of the polymer can comprise processing a polymer such that a polymer matrix is formed and subsequently applying the at least one electromagnetic radiation sensitive additive, acid sensitive additive, or both to the polymer matrix in any suitable manner as will be discussed further herein. In yet other examples, processing of the polymer can comprise processing a polymer such that a polymer matrix is formed and subsequently infusing the at least one electromagnetic sensitive additive, acid sensitive additive, or both into the polymer matrix as will be discussed further herein.

In some embodiments, the electromagnetic radiation transparent material can comprise a cured polymer matrix. These cured polymer matrices can be provided in any suitable manner, and compositions for producing a mask are additionally provided. The compositions comprise an uncured polymer and at least one electromagnetic radiation sensitive additive, acid sensitive, or both. The compositions comprise at least one electromagnetic radiation sensitive portion. According to some embodiments, the uncured polymer is processed to form an electromagnetic radiation transparent layer. For example, the uncured polymer may processed by curing. Upon curing of the polymer, the electromagnetic radiation sensitive mask material is formed. This electromagnetic radiation sensitive mask material performs as discussed above.

In some examples, the electromagnetic radiation sensitive additive, the acid sensitive additive, or both is dispersed in the cured polymer matrix. For example, the electromagnetic radiation sensitive additive, the acid sensitive additive, or both, the uncured polymer, and a suitable solvent can be mixed to disperse the electromagnetic radiation sensitive additive, acid sensitive additive, or both in the matrix. Subsequently, the uncured polymer can be cured to form the electromagnetic radiation sensitive mask material. In other examples, the at least one electromagnetic radiation sensitive additive, acid sensitive additive, or both may be provided in a layer proximate to the cured polymer matrix. In this example, the polymer matrix may be cured, and the at least one electromagnetic radiation sensitive additive, acid sensitive additive, or both may be provided in contact with one or more surfaces of the cured polymer matrix. In yet other examples, the at least one electromagnetic radiation sensitive additive, acid sensitive additive, or both may be infused into the cured polymer matrix.

In other embodiments, the electromagnetic radiation transparent material can comprise a thermoplastic polymer matrix. These thermoplastic polymer matrices can be provided in any suitable manner, and compositions for producing a mask are also provided. The compositions comprise a thermoplastic polymer and at least one electromagnetic radiation sensitive additive, acid sensitive additive, or both. The compositions comprise at least one electromagnetic sensitive portion. The thermoplastic polymer is processed to form the electromagnetic radiation transparent layer. For example, the thermoplastic polymer can be processed by compounding or solution casting. This electromagnetic radiation sensitive mask material performs as discussed above.

In some examples, the at least one electromagnetic radiation sensitive additive, acid sensitive additive, or both is dispersed in the thermoplastic polymer matrix. For example, the at least one electromagnetic radiation sensitive additive, acid sensitive additive, or both and the thermoplastic polymer can be mixed at a temperature above the melting point of the thermoplastic polymer. Subsequently, the thermoplastic polymer can be formed into a film by suitable techniques to form the electromagnetic radiation sensitive mask material. In other examples, the at least one electromagnetic radiation sensitive additive, acid sensitive additive, or both may be provided in a layer proximate to the thermoplastic polymer matrix. In this example, the polymer matrix may be already formed into a film and the at least one electromagnetic radiation sensitive additive, acid sensitive additive, or both may be provided in contact with one or more surfaces of the thermoplastic polymer matrix. In yet further examples, the at least electromagnetic radiation sensitive additive, acid sensitive additive, or both may be infused into the thermoplastic polymer matrix.

In yet other embodiments, the electromagnetic radiation transparent material can comprise a soluble polymer matrix. These soluble polymer matrices can be provided in any suitable manner, and compositions for producing a mask are provided. The compositions comprise a soluble polymer and at least one electromagnetic radiation sensitive additive, acid sensitive additive, or both. The compositions comprise at least one electromagnetic sensitive portion. The soluble polymer is processed to form the electromagnetic radiation sensitive mask material. For example, the soluble polymer can be processed by evaporating a solvent to form a soluble polymer matrix. This electromagnetic radiation sensitive mask material performs as discussed above.

In some examples, the at least one electromagnetic radiation sensitive additive, acid sensitive additive, or both is dispersed in the soluble polymer matrix. For example, the at least one electromagnetic radiation sensitive additive, acid sensitive additive, or both and the soluble polymer can be mixed in a solvent. Subsequently, the soluble polymer can be formed into a film by suitable techniques to form the electromagnetic radiation sensitive mask material. In other examples, the at least one electromagnetic radiation sensitive additive, acid sensitive additive, or both may be provided in a layer proximate to the soluble polymer matrix. In this example, the polymer matrix may be already formed into a film and the at least one electromagnetic radiation sensitive additive, acid sensitive additive, or both may be provided in contact with one or more surfaces of the soluble polymer matrix. In yet other examples, the polymer matrix may be formed into a film, and the at least one electromagnetic radiation sensitive additive, acid sensitive additive, or both may be infused into the polymer matrix.

In some embodiments, the curable, thermoplastic, or soluble polymers that form the matrix do not react to electromagnetic radiation. In other embodiments, the curable, thermoplastic, or soluble polymers that form the matrix may react to electromagnetic radiation. For example, modified polymers that contain at least one electromagnetic radiation sensitive portion may be provided. In this example, the electromagnetic radiation sensitive mask material can comprise the polymer alone. Alternatively, additional electromagnetic radiation sensitive additives, additional acid sensitive additives, or both may be provided.

In other embodiments, the curable, thermoplastic, or soluble polymer may be a polymer that produces an acidic species upon exposure to electromagnetic radiation. For example, the composition can comprise at least one acid sensitive additive that may cause a change in transmittance of the electromagnetic sensitive material, as will be discussed further herein. Such polymers include, but are not limited to, chlorine containing polymers such as polyvinyl chloride (PVC), polyvinylidine chloride (PVDC), or ethylene chlorotrifluoroethylene (ECTFE). These polymers may be exposed to electromagnetic radiation and this exposure can cause elimination of hydrochloric acid (HCl) from the polymer backbone through a dehydrochlorination reaction.

Examples of additional suitable curable, thermoplastic, and soluble polymer matrices include, but are not limited to styrene and ethylene/butylene linear block copolymers, such as Kraton G1652, styrene and ethylene/butylene linear block copolymers having maleic anhydride, such as Kraton FG1901, and aliphatic polyurethanes such as Clearflex Polyurethane 50A or 90A. Other electromagnetic radiation transparent polymer matrices include, but are not limited to, polyolefins, such as oriented polypropylene (OPP); cycloolefins, such as Topas, Surlyn (ionomer); polyesters; polyethers; polyimides; isoprene polymers and copolymers; amorphous polymers like polymethyl methacrylate (PMMA), polycarbonate (PC), styrene acrylonitrile (SAN), polystyrene (PS); as well as fluoropolymers, such as Teflon AF, ethylene trifluoroethylene (ETFE), and fluorinated ethylene propylene (FEP). It will be understood that any suitable combinations of the polymer matrix materials can also be used. The selection of polymer can depend on a number of factors, such as flexibility, processability, and any other desired properties.

Figure 3:
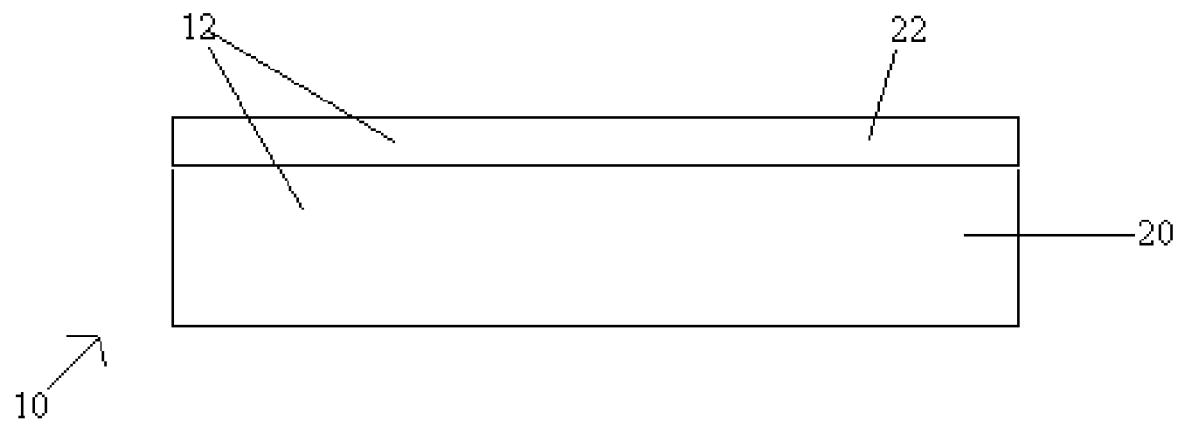
FIG. 3 is side view of an another mask in accordance with various embodiments of the invention.

It will be understood that any suitable configuration of the electromagnetic radiation sensitive mask material may be utilized. For example, as shown in FIG. 3, the electromagnetic radiation sensitive mask material 12 can comprise an electromagnetic radiation transparent layer 20 and a layer having at least one electromagnetic radiation sensitive additive or acid sensitive additive 22 disposed on the electromagnetic radiation transparent layer 20. In other examples, at least one electromagnetic radiation sensitive additive, acid sensitive additive, or both may be disposed between two or more electromagnetic radiation transparent layers (not shown). In yet further examples, at least one electromagnetic radiation sensitive additive, acid sensitive additive, or both may be disposed on two or more electromagnetic radiation transparent layers (not shown). Alternatively, as discussed above, the electromagnetic radiation sensitive mask material can comprise a single layer, as shown in FIG. 1, wherein the at least one electromagnetic radiation sensitive additive, acid sensitive additive, or both is dispersed within the electromagnetic radiation transparent layer.

It will be understood that the electromagnetic radiation transparent layers may be formed in any suitable manner. For example, the electromagnetic radiation transparent layer, the electromagnetic radiation sensitive additive or additives, acid sensitive additive or additives, or both and a suitable solvent may be mixed to provide a solution that may be cast, spin coated, molded, or formed in any other suitable manner and processed to provide the electromagnetic radiation sensitive mask material. It will be understood that the conditions under which the electromagnetic radiation sensitive mask material are formed and processed may be selected as suitable for each particular configuration. For example, suitable solvents for the polymers identified above include, but are not limited to, toluene, chloroform, methyl ethyl ketone, xylene and mixtures thereof. In some examples, the solids content of the solution is from about 10 percent to about 40 percent by weight. In other examples, the solids content of the solution is about 25 percent by weight, or about 20 percent by weight, or about 15 percent by weight.

In other examples, at least one electromagnetic radiation transparent layer may be formed in a suitable manner and the electromagnetic radiation sensitive additive or additives, acid sensitive additive or additives, or both may be infused into the at least one electromagnetic radiation transparent layer. For example, the electromagnetic radiation sensitive additive or additives, acid sensitive additive or additives, or both may be dissolved in a solvent that does not act as a solvent for the at least one electromagnetic radiation transparent layer. Subsequently, the solution may be spray coated onto the at least one electromagnetic radiation transparent layer and allowed to infuse into the electromagnetic radiation transparent layer. It will be understood that the electromagnetic radiation sensitive additive or additives, acid sensitive additive or additives, or both may be infused into the at least one electromagnetic radiation transparent layer in any suitable manner.

The electromagnetic radiation sensitive mask material can be formed as a single component film or sheet. Alternatively, a layer or layers having at least one electromagnetic radiation sensitive additive can be integrated on or into a multilayer structure that may contain additional layers comprising electromagnetic radiation transparent polymer matrices. For example, the electromagnetic radiation sensitive additive can be deposited as a coating on a preformed polymer matrix film. Alternatively, a polymer film having at least one electromagnetic radiation sensitive additive can be laminated with a preformed polymer film or coextruded to form a multilayer structure. In this way, large area parts can be produced readily using a wide variety of base polymer films that satisfy the requirements of electromagnetic transparency in the wavelength range of interest and mechanical/physical properties e.g. tensile strength and percent elongation. The layers can be formed from the same or different polymers, depending on properties such as interfacial adhesion, refractive index matching, and stress-strain elongation behavior of the composite. The layers can be of different thickness, for example a thin electromagnetic radiation sensitive layer can be combined with one or more thicker electromagnetic radiation transparent layers. In one example, the electromagnetic radiation sensitive additives may be included in a styrene-copolymer resin (SEBS) and deposited on a commercial styrene-copolymer film (Diamant Film, Inc.). In another example, the same formulation may be coated on a commercial polyvinylidine chloride-polyvinyl chloride (PVDC/PVC) copolymer film such as Saran Wrap®. Such multilayer structures may have advantages in cost, durability and handling compared to the single layer films.

It will be understood that the electromagnetic radiation sensitive mask material can be provided in any suitable manner. For example, the electromagnetic radiation sensitive mask material can be provided as perforated or unperforated sheets. In another example, the electromagnetic radiation sensitive mask material can be provided as perforated or unperforated rolls of material. Such rolls can be used in accordance with any suitable system to provide in-line exposure of the mask and patterning of a part.

In some examples, the polymer matrix is chosen to provide desired properties. For example, the matrix may be chosen to be deformable such that the electromagnetic radiation sensitive mask material is deformable. In some cases the electromagnetic radiation sensitive mask material can deform by about 30 percent to about 100 percent or by about 100 percent to about 500 percent. This deformability may be useful when using the masks for contact patterning on complex surfaces, such as curved surfaces and surfaces having features. In other examples, the electromagnetic radiation sensitive mask material can deform at a temperature of less than about 50° C., and this may be useful when the substrate to be patterned can not be exposed to elevated temperatures. In other examples, the polymer matrix can be chosen to have a desired tensile strength, hardness, and/or viscosity. In further examples, the electromagnetic radiation transparent layer can be rigid.

An electromagnetic radiation sensitive additive may be any suitable additive that is sensitive to electromagnetic radiation at a desired wavelength. The electromagnetic radiation sensitive additive may be chosen to undergo a particular chemical reaction at the second wavelength such that the transmissivity of electromagnetic radiation at the first wavelength through an area containing the electromagnetic radiation sensitive additive is changed after exposure of the electromagnetic radiation sensitive additive to the second wavelength. This electromagnetic radiation sensitive additive allows the electromagnetic radiation sensitive mask material to be patterned as discussed herein and used as a mask. For example, suitable compound that undergoes a chemical reaction upon exposure to electromagnetic radiation may be used.

An acid sensitive additive may be any suitable additive that is sensitive to the presence of an acidic species. In some cases, the acid sensitive additive itself may cause a change such that the transmissivity of electromagnetic radiation at the first wavelength through an area containing the acid sensitive additive is changed after the exposure of the electromagnetic radiation sensitive material to the second wavelength. For example, the electromagnetic radiation sensitive mask material may have an electromagnetic sensitive additive or an electromagnetic sensitive polymer that produces an acidic species upon exposure to electromagnetic radiation of the second wavelength. According to some examples, the mask material also has an acid sensitive additive. The presence of the acidic species causes the acid sensitive additive to undergo a chemical reaction. This chemical reaction is chosen such that the transmissivity of the mask material to electromagnetic radiation at the first wavelength is different after exposure of the material to electromagnetic radiation at the second wavelength. It will be understood that the acid sensitive additive may be sensitive to electromagnetic radiation at a wavelength different from an electromagnetic radiation sensitive additive that is also present. Thus, in some cases, the electromagnetic radiation exposure wavelength can be chosen to either produce an acidic species from the electromagnetic radiation sensitive additive to activate the acid sensitive additive or the wavelength could be chosen to directly activate the acid sensitive additive.

In one example, electromagnetic radiation sensitive additives that undergo photo elimination reactions may be used. For example, leuco dyes, such as fluoran leuco dyes that undergo alkyl elimination upon exposure to electromagnetic radiation of a particular wavelength, may be used. In some examples, the leuco dyes are chosen to exhibit a permanent change after exposure to a particular electromagnetic radiation source.

Figure 4A:
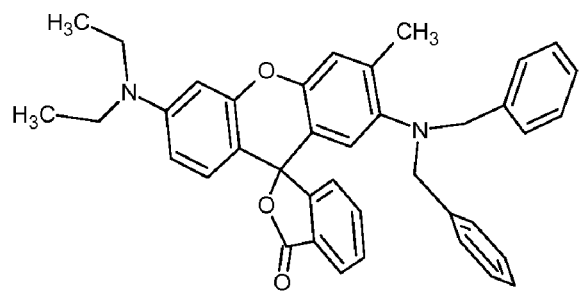
FIGS. 4A-4F are illustrations of electromagnetic radiation sensitive additives that may be used in accordance with various embodiments of the present invention.
Figure 4B:
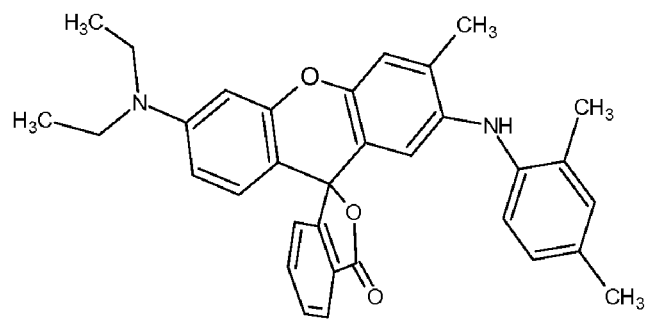
Figure 4C:
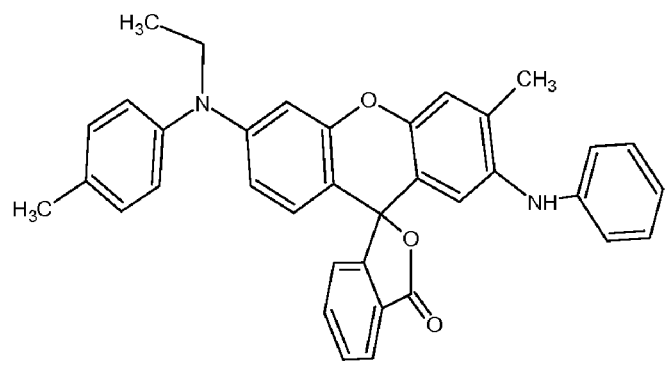
Figure 4D:
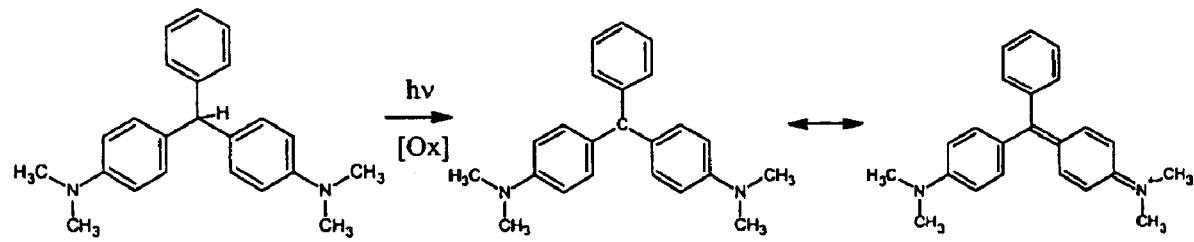
Figure 4E:
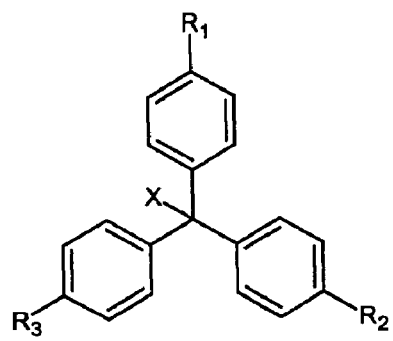
Figure 4F:
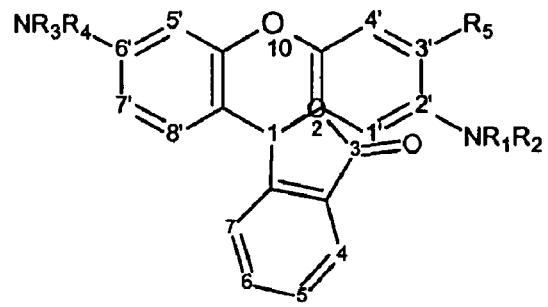

In another example, compounds that undergo photo-oxidation upon exposure to electromagnetic radiation may be used. For example, a different type of leuco dye based on triarylmethanes e.g. Leuco Malachite Green or 4,4'-Benzylidenebis(N,N-Dimethyl Aniline) may be used. Upon exposure to electromagnetic radiation of particular wavelength range, this compound undergoes photo-oxidation as shown in FIG. 4D. Other triaryl and diaryl methane compounds can also be used.

Figure 5:
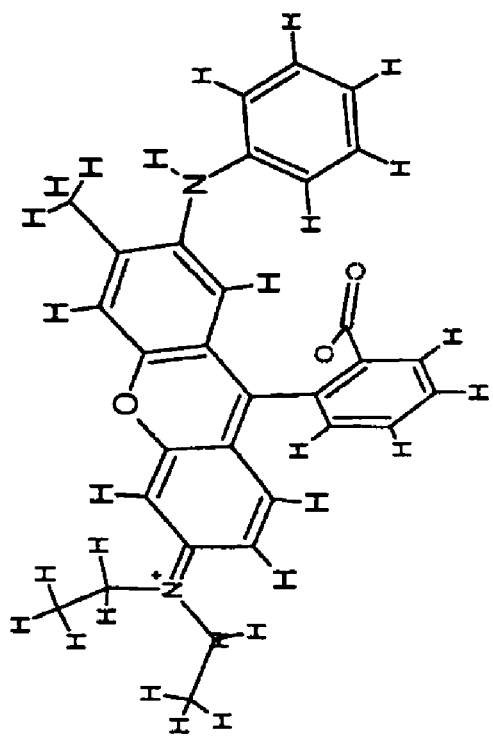
FIG. 5 is a schematic of the reaction between a leuco form of an electromagnetic radiation sensitive additive and electromagnetic radiation.
Figure 5:
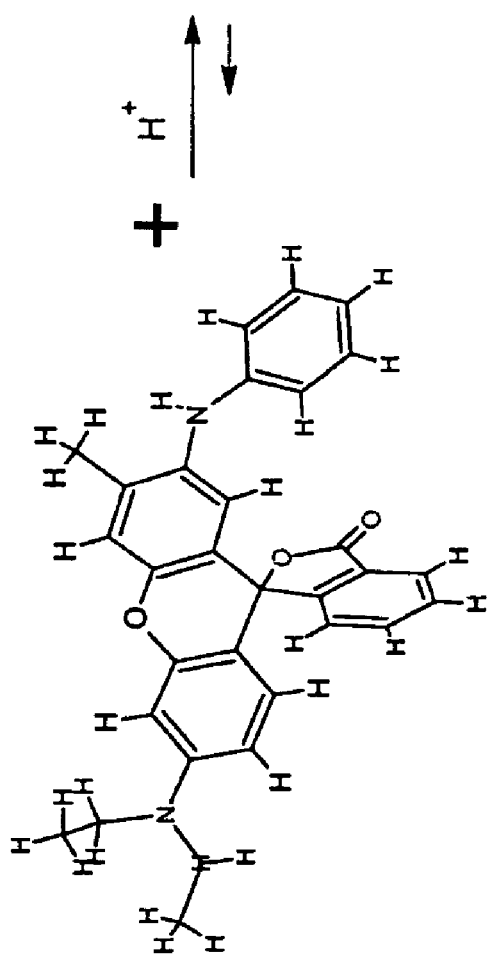

In further examples, an electromagnetic sensitive photo acid generator may be used in conjunction with an acid sensitive additive, to achieve discrete color formation. Suitable acid sensitive additives include, but are not limited to, leuco dyes and acid indicators such as phenolphthalein. FIG. 5 shows the reaction scheme by which a colored form of a leuco dye can be achieved. Generally, the photo acid generator is selected to produce an acidic species at a desired wavelength. The production of the acidic species at the desired wavelength of electromagnetic radiation causes the leuco dye to change from the colorless to the colored state. The use of a photo acid generator can allow the portion of the electromagnetic radiation sensitive mask material exposed to electromagnetic radiation at the second wavelength to exhibit a visible color change. This visible color change may be useful in allowing a user to properly align the mask. Suitable leuco dyes include, but are not limited to, Pergascript Green I-2GN (FIG. 4A) available from Ciba-Geigy, Black XV (FIG. 4B) available from ESCO, and ODB-250 (FIG. 4C) available from ESCO. For example, Black XV can be used with a photo acid generator that produces $H^+$ at about 320 nm to cause the Black XV to become colored. Suitable photo acid generators include, but are not limited to the Irgacure series available from Ciba Geigy for example Irgacure 203. The leuco dye and/or the photo acid generator may be used in any suitable amount. For example, from about 0.5 percent by weight to about 10 percent by weight of the leuco dye may be used. In other examples, about 0.5 percent by weight or about 2 percent by weight of the leuco dye may be used. In a further example, about 0.5 percent by weight to about 10 percent by weight of the photo acid generator may be used. In a further example, about 0.5 percent by weight to about 2 percent by weight of the photo acid generator may be used.

In yet further examples, the compositions can comprise a polymer that is electromagnetic radiation sensitive such that an acidic species is produced and an acid sensitive additive. Examples of suitable polymers useful according to such examples, include, but are not limited to, chlorine containing polymers such as polyvinyl chloride (PVC), polyvinylidine chloride (PVDC), or ethylene chlorotrifluorethylene (ECTFE). Examples of suitable acid sensitive additives include, but are not limited to, acid sensitive Leuco Dye such as but not limited to the Fluoran leuco dyes Black XV (ESCO) and Pergascript Green I-2GN (Ciba-Geigy). Upon exposure of the mask material to electromagnetic radiation of a wavelength suitable to cause the polymer to produce an acid sensitive species, an open zwitterion form of the dye may occur that causes a color change. In other examples, the mask material may be exposed to electromagnetic radiation of a wavelength suitable to cause a reaction of the dye. In this case, an alkyl elimination product that produces a different color change may occur.

Figure 6:
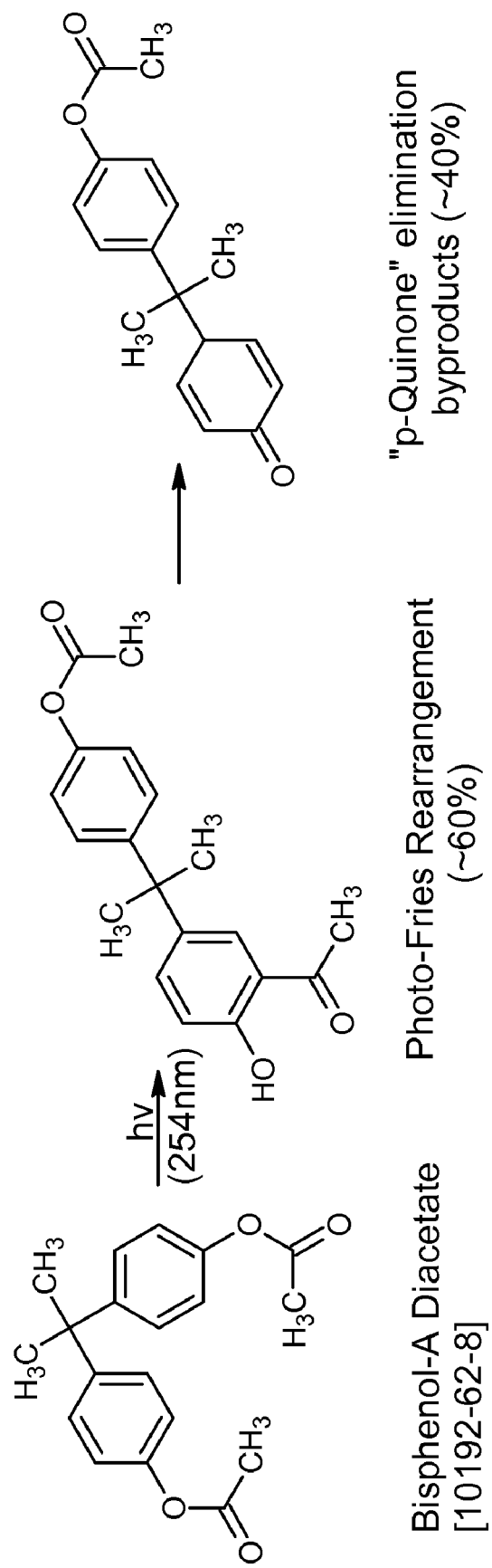
FIG. 6 is schematic illustration of a bisphenol-A diacetate electromagnetic additive undergoing photo-fries rearrangement.

Other examples of suitable electromagnetic radiation sensitive additives include compounds that undergo a photo rearrangement reaction. For example, compounds that undergo a photo-fries rearrangement may be used. One such photo-fries rearrangement of bisphenol-A diacetate is shown in FIG. 6. The photo-fries rearrangement occurs predominantly at a specific wavelength region, and this wavelength is generally chosen to be the second wavelength of electromagnetic radiation to which the electromagnetic radiation sensitive mask material is exposed. Once the compound is exposed to the second wavelength, the molecular structure is rearranged, and the rearranged molecular structure may transmit a different amount of electromagnetic radiation at the first wavelength. Thus, these electromagnetic radiation sensitive additives may be used to provide patternable masks. Examples of compounds that undergo photo-fries rearrangement, include, but are not limited to phenolic derivates such as aromatic esters like bisphenol-A diacetate and catechol diacetate.

For example, bisphenol-A diacetate in the electromagnetic radiation sensitive mask material can be exposed to electromagnetic radiation at about 254 nm to cause the rearrangement. Subsequently, electromagnetic radiation at a first wavelength of about 340 nm can be used for patterning of a substrate. Similarly, catechol diacetate in the electromagnetic radiation sensitive mask material can be exposed to electromagnetic radiation at about 254 nm to cause the rearrangement, and the first wavelength can be about 320 nm. The compounds that undergo photo-fries rearrangement may be used in any suitable amount. For example, from about 0.5 percent by weight to about 10 percent by weight of the compounds may be used. For example, about 0.5 percent by weight to about 2 percent by weight of the compound may be used.

Figure 7:
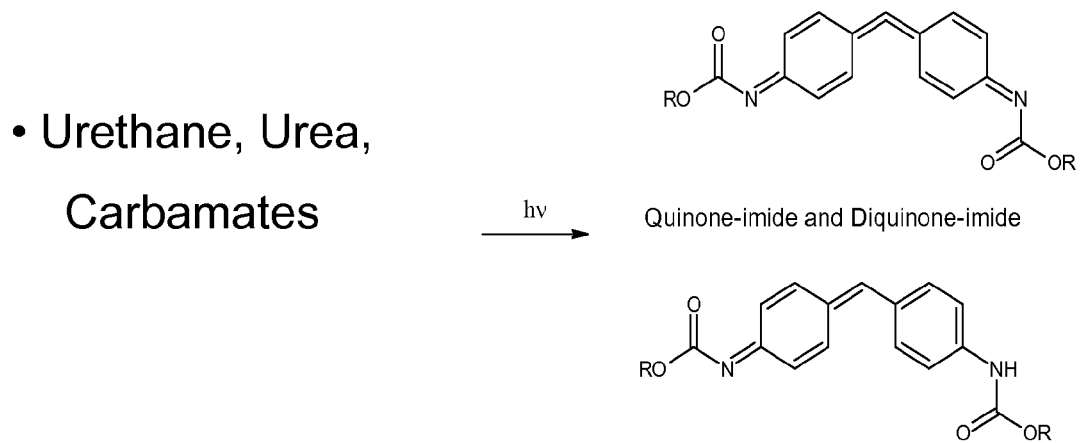
FIG. 7 is a schematic illustration of the reaction of certain electromagnetic additives in the presence of electromagnetic radiation.
Figure 8:
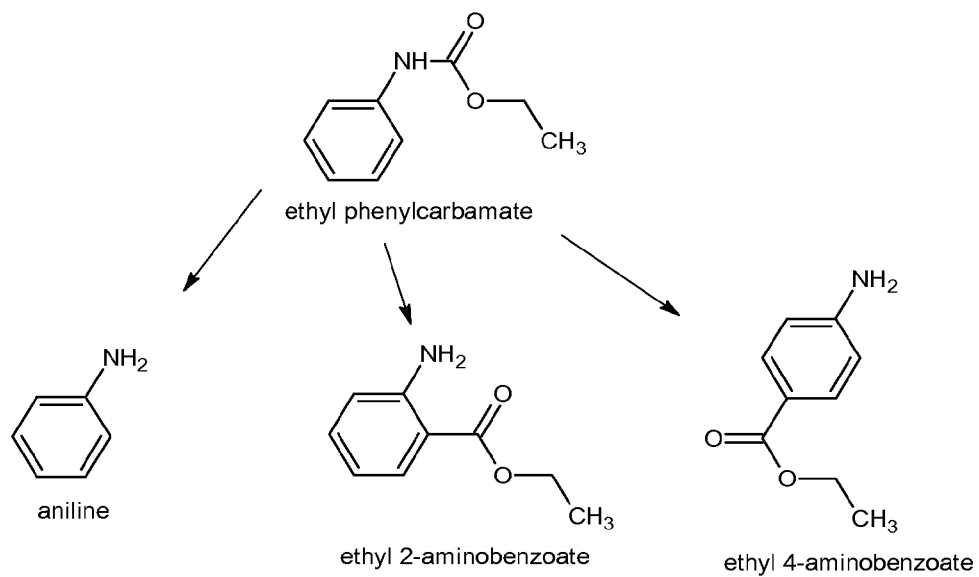
FIG. 8 is a schematic illustration of the reaction of yet another electromagnetic radiation sensitive additive.
Figure 9:
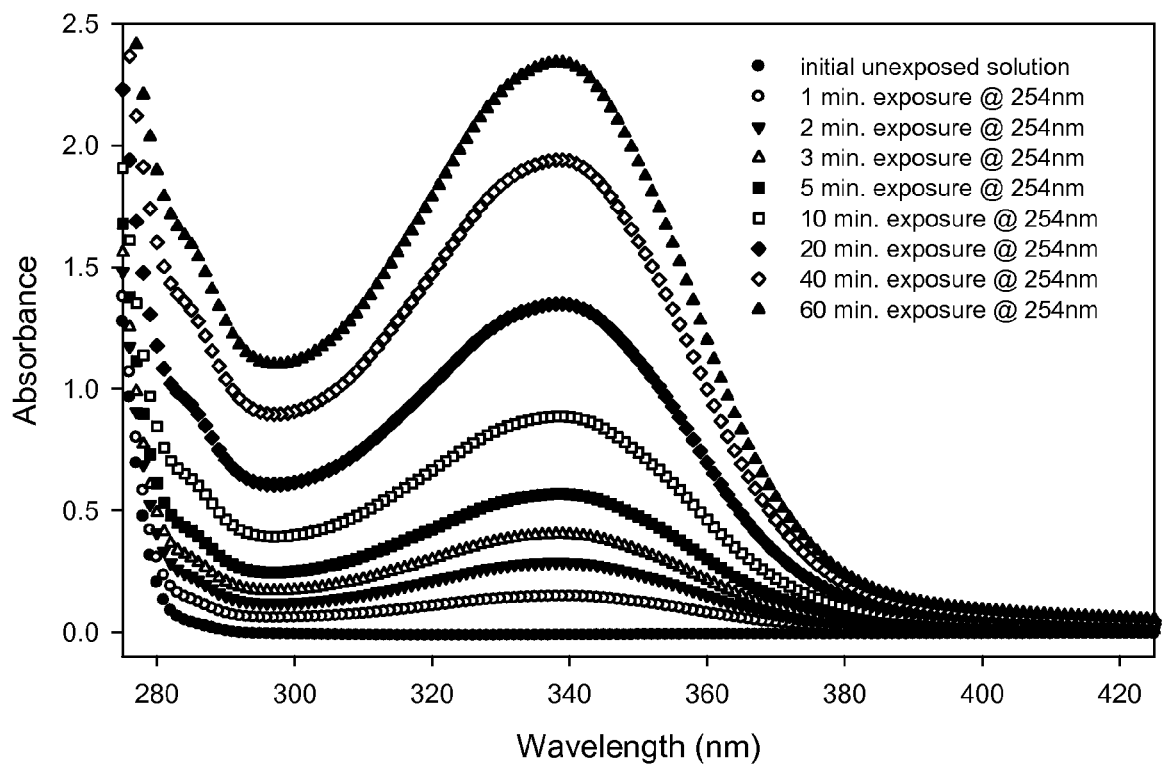
FIG. 9 is a graph of photochemical generation of photo-fries products of aromatic ester electromagnetic radiation sensitive additive in solution ($CHCl_3$)
Figure 10:
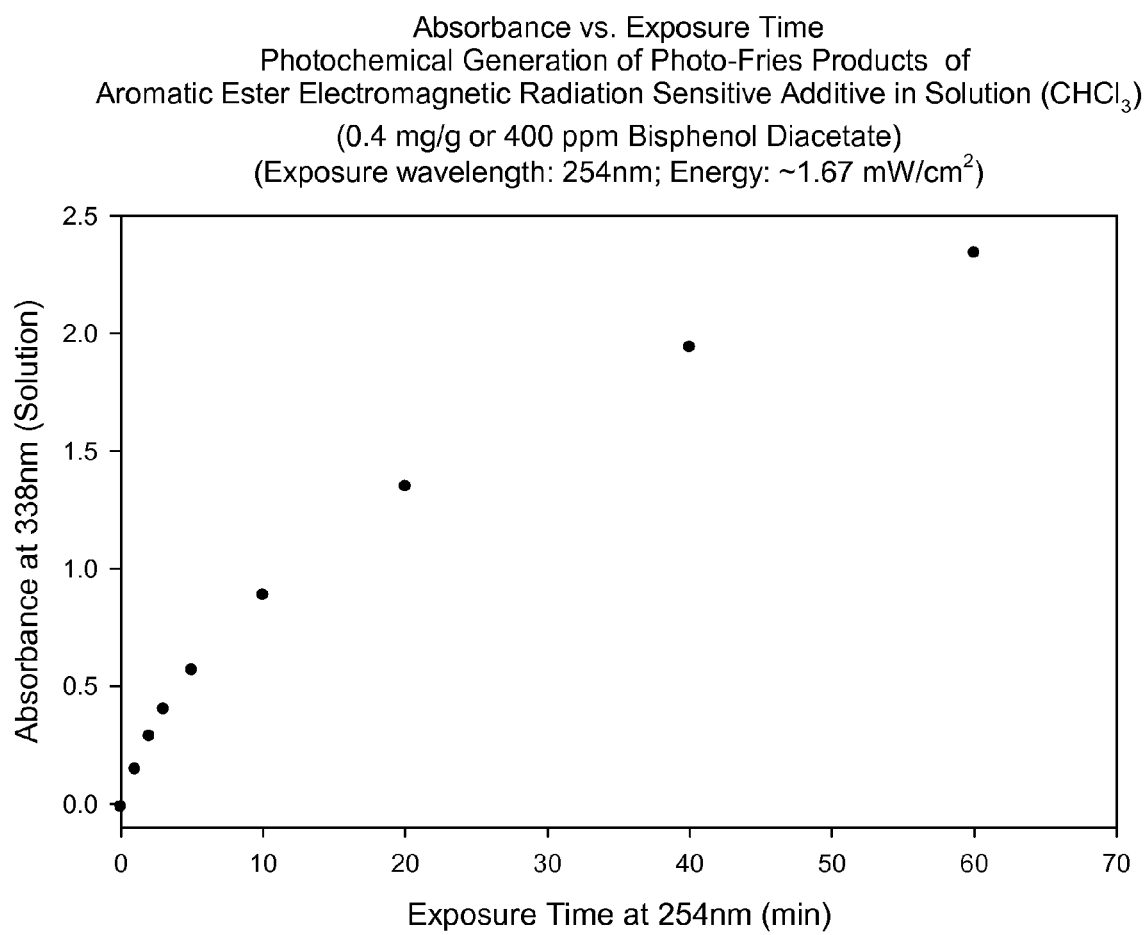
FIG. 10 is a graph of absorbance v. exposure time for photochemical generation of photo-fries products of aromatic ester electromagnetic radiation sensitive additive in solution ($CHCl_3$)
Figure 11:
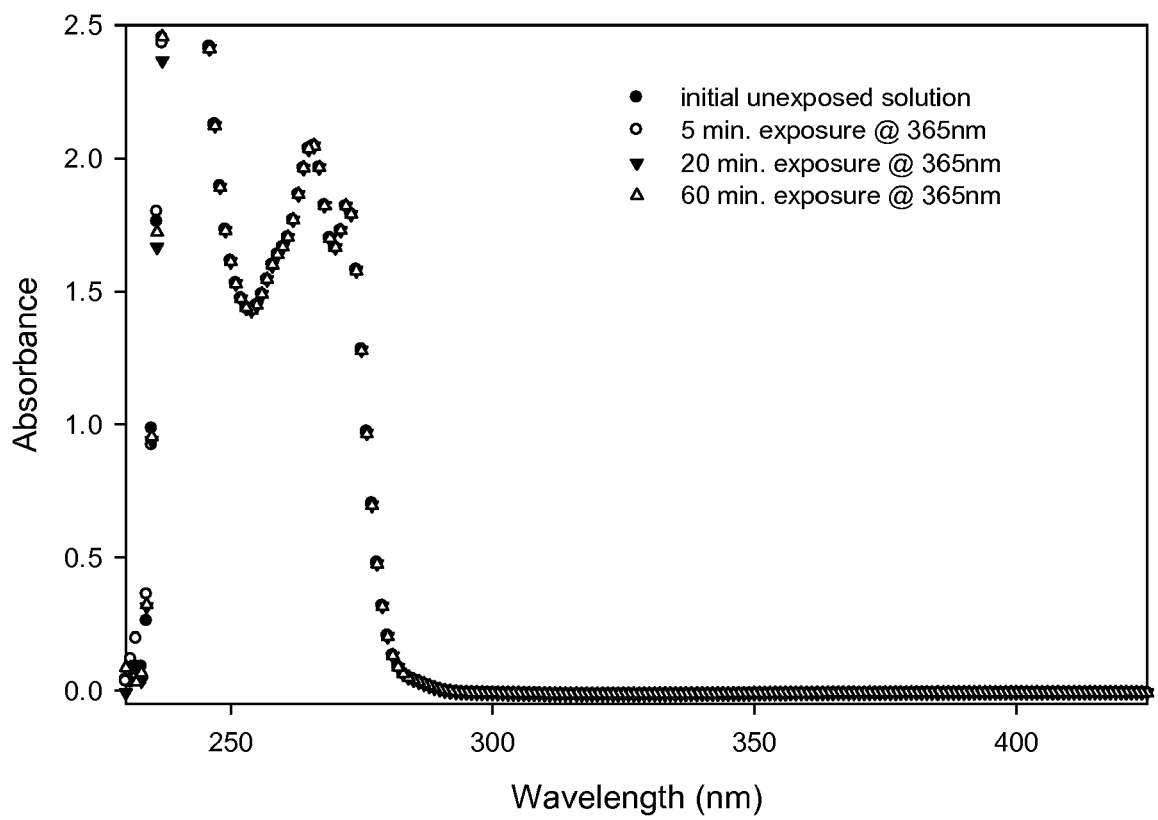
FIG. 11 is a graph of photochemical stability of aromatic ester electromagnetic radiation sensitive additive in solution ($CHCl_3$) at typical photolithographic exposure wavelength (~365 nm)
Figure 12:
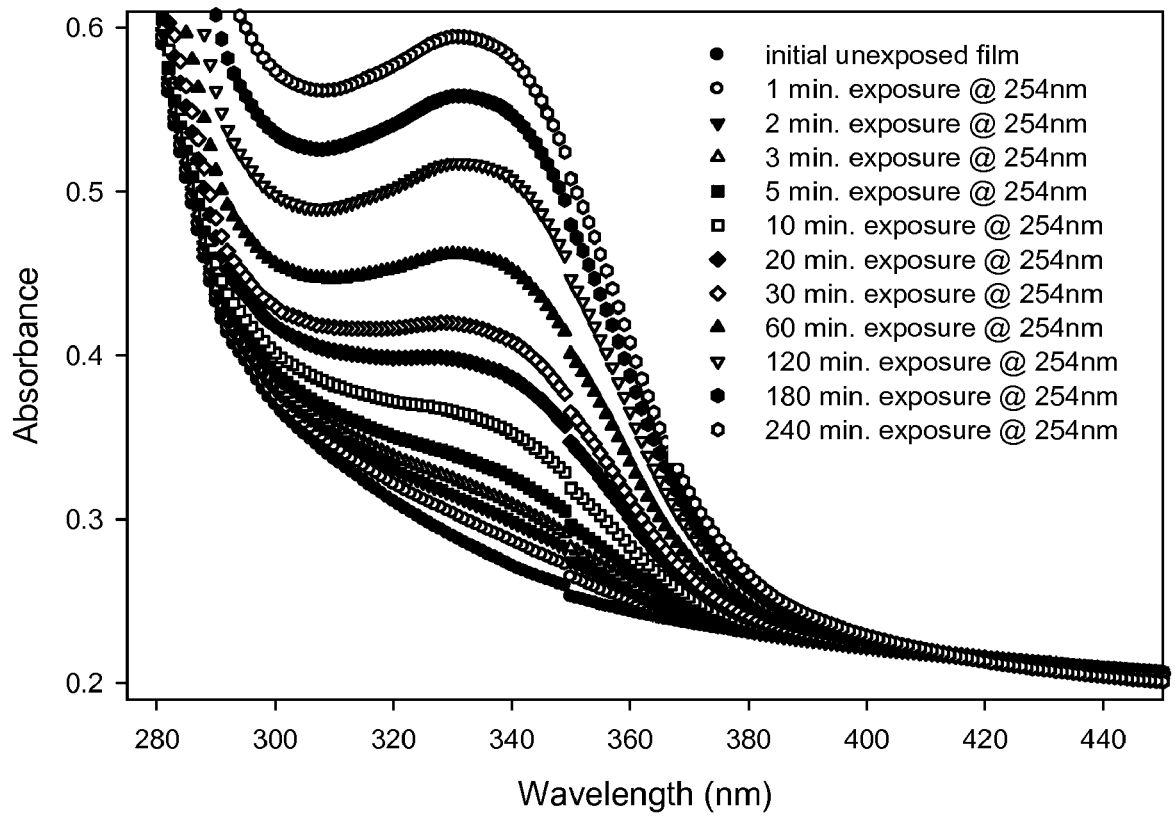
FIG. 12 is a graph of mask generation film spectra for thermoplastic elastomer (TPE) containing aromatic ester electromagnetic radiation sensitive additive based on photo-fries rearrangement products.
Figure 13:
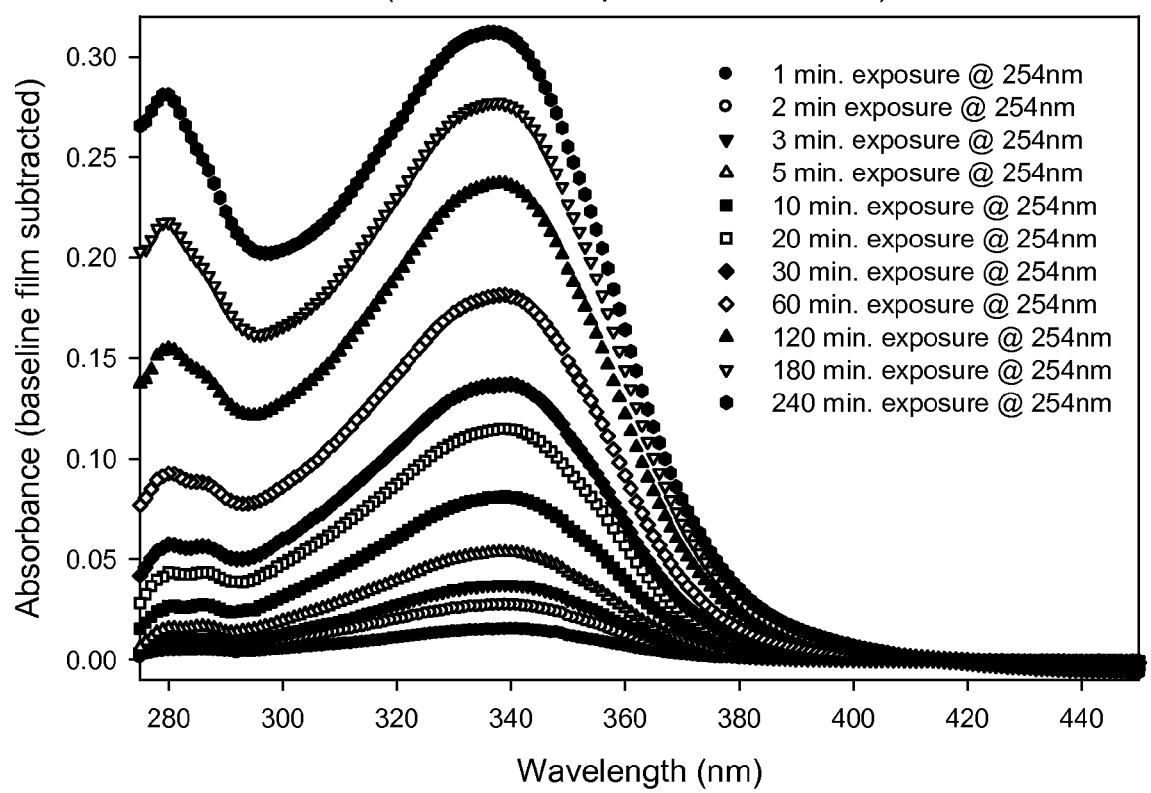
FIG. 13 is another graph of mask generation film spectra for thermoplastic elastomer (TPE) containing aromatic ester electromagnetic radiation sensitive additive based on photo-fries rearrangement products.
Figure 14:
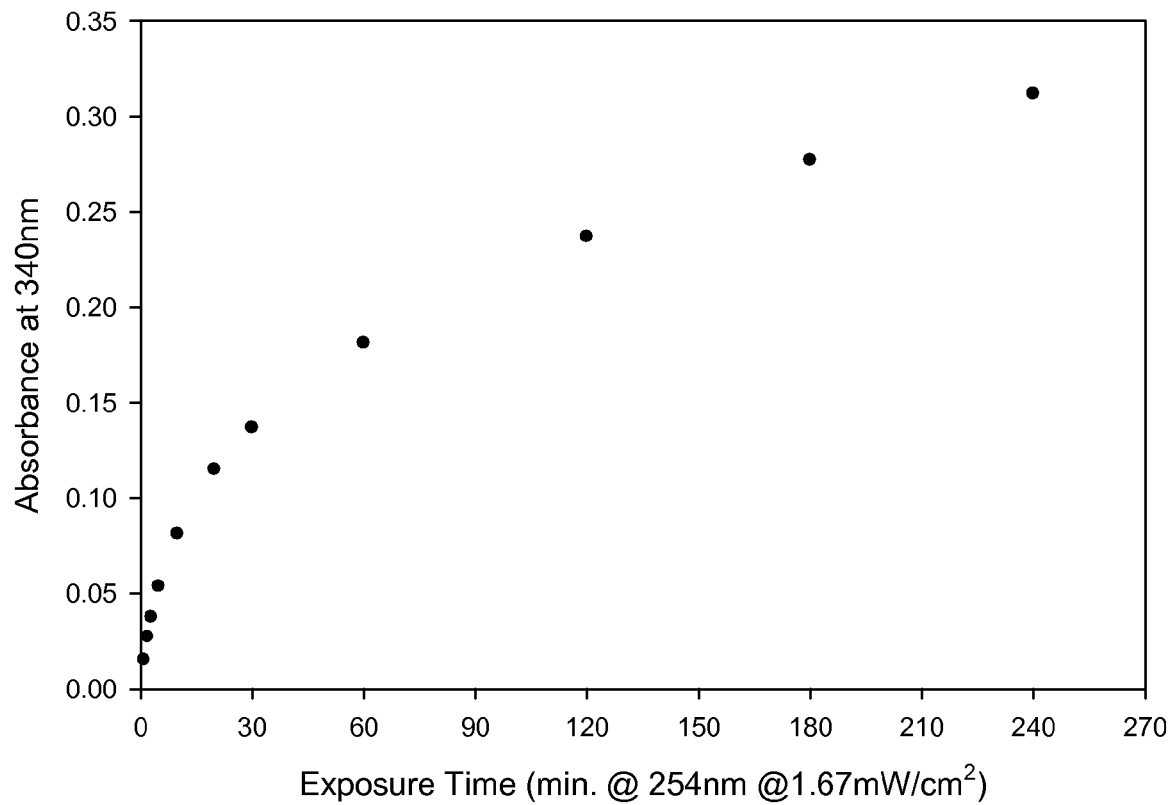
FIG. 14 is a graph of mask film generation rate for thermoplastic elastomer (TPE) containing aromatic ester electromagnetic radiation sensitive additive based on photo-fries rearrangement products.
Figure 15:
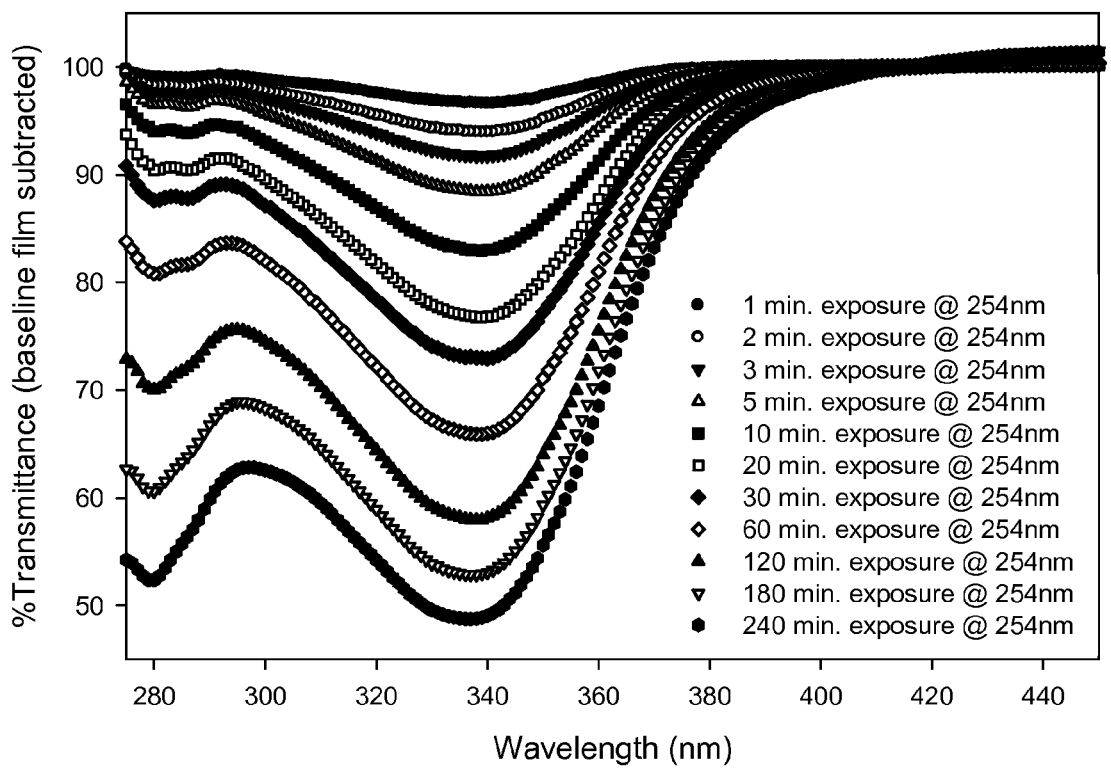
FIG. 15 is a graph of mask generation film transmittance for thermoplastic elastomer (TPE) containing aromatic ester electromagnetic radiation sensitive additive based on photo-fries rearrangement products.

Further examples of suitable electromagnetic radiation sensitive additives include compounds that generate photo-fries products. These electromagnetic radiation sensitive additives include, but are not limited to, aromatic isocyanate urethane, urea, and carbamate derivatives. The mechanism by which photo-fries products may be generated is shown in FIG. 7. For example, polyurethane or polyurea dimers, trimers, or oligomers such as diethylamine-diphenlymethane diisocyanate di-urea may be used. Alternatively, carbamates such as ethyl phenylcarbamate may be used as shown in FIG. 8. These urethane, urea, or carbamate groups may be present in the side-chains of backbones of polymers. These photo-fries generated compounds generally will transmit electromagnetic radiation at the first wavelength at a different percentage than the unreacted electromagnetic radiation sensitive additives. The compounds that undergo photo-fries generation of products may be used in any suitable amount. For example, from about 0.5 percent by weight to about 10 percent by weight of the compounds may be used. In a further example, about 0.5 percent by weight to about 2 percent by weight may be used.

It will be understood that any other suitable electromagnetic radiation sensitive additives, acid sensitive additives, electromagnetic radiation sensitive additive systems, acid sensitive additive systems, or combinations thereof may be employed. Generally, the electromagnetic radiation sensitive additives, acid sensitive additives, or both are selected such that the first wavelength is a wavelength compatible with a particular treated or untreated substrate in the patterning system being employed. It will be further understood that in examples when a electromagnetic radiation sensitive additive, acid sensitive additive, or both is dispersed or infused in a polymer matrix, the mobility of the additive within the matrix may be of concern. Having an additive that is too mobile for a particular system may degrade the useful life of the mask after the electromagnetic radiation sensitive mask material is exposed to the electromagnetic radiation of the second wavelength. The mobility of an additive depends on several factors including the mean free path, the size of the molecule, and the temperature to which the electromagnetic radiation sensitive mask material is exposed. Thus, the additive will be chosen for a particular application. Additionally, the concentration and processing temperatures can be controlled to control the mobility of the molecule.

Additionally, it will be understood that the electromagnetic radiation at the second wavelength can have any suitable intensity and can be provided for any suitable length of time. For example, the areas of electromagnetic radiation sensitive mask material for patterning can be exposed to the electromagnetic radiation of the second wavelength for from a few seconds to a few minutes or less at high intensity to about 300 minutes or more at very low intensity. The amount of time for the exposure and the intensity can be selected depending on the particular electromagnetic radiation sensitive additive used for the electromagnetic radiation sensitive mask material.

In accordance with embodiments of the present invention, patterning methods employing the masks described herein are provided. The methods comprise exposing at least one selected portion of a mask comprising a electromagnetic radiation sensitive mask material having at least one electromagnetic radiation sensitive additive to electromagnetic radiation at a patterning wavelength to cause a reaction of the at least one electromagnetic radiation sensitive additive such that a pattern is formed in the mask and subsequently exposing a substrate electromagnetic radiation at an exposure wavelength through the mask. The substrate is sensitive to electromagnetic radiation at an exposure wavelength. For purposes of defining and describing the present invention, the term "pattern" shall be understood as referring to areas of the mask that have been exposed to electromagnetic radiation of the patterning wavelength and through which electromagnetic radiation at an exposure wavelength is transmitted to a greater or lesser extent than through areas of the mask that have not been exposed to electromagnetic radiation of the patterning wavelength. Additionally, it will be understood that a pattern "in" the electromagnetic radiation sensitive mask material may be a pattern formed on top of or inside the material, or a combination thereof. It will be understood that the patterning wavelength is the second wavelength as discussed herein. It will be further understood the exposure wavelength is the first wavelength as discussed herein. The patterning and exposure wavelength may be the same or different.

The substrate may be made sensitive to electromagnetic radiation at an exposure wavelength in any suitable manner. For example, a photoresist may be provided on the substrate and developed after the pattern has been formed thereon. Alternatively, the substrate may be made sensitive to the radiation such that a surface charge is provided on an exposed area of the substrate. The substrate may be subsequently processed in any suitable manner, for example by using a toner and curing. In other examples, the substrate may comprise a mask of the present invention. In other cases, substrates amenable to photo-imaging may be provided.

The electromagnetic radiation sensitive mask material may be exposed to the electromagnetic radiation at the patterning wavelength in any suitable manner. For example, a traditional mask having a particular pattern may be placed in contact with the mask and the mask can be exposed to the electromagnetic radiation of the patterning wavelength for the desired period of time. This exposure causes the selected reaction of the electromagnetic radiation sensitive additive or additives such that the exposed areas of the mask transmit a different percentage of electromagnetic radiation at the exposure wavelength than the unexposed areas. In this manner, a mask that does not require extensive wet chemistry can be formed. In other examples, direct write systems may be used to expose the mask to electromagnetic radiation of a patterning wavelength. The present invention can be used to form features of any suitable dimension. For example, features of from about 1 µm to about 300 µm or more can be resolved using the masks of the present invention. In other examples, features of less than 10 µm can be resolved.

In cases where a photoresist is used on the substrate, the photoresist may be any suitable photoresist. It will be understood that particular photoresists may be chosen depending on the substrate being patterned and the desired exposure wavelength. The photoresist can be developed in accordance with any suitable methods.

Additionally, the substrate may be any suitable substrate that can be used in the patterning processes. It will be further understood that dark field masks and light field masks may be produced in accordance with the present invention. The patterning and exposure wavelengths may be any suitable wavelength. In some examples, the exposure wavelength comprises about 365 nm.

The masks of the present invention can be used for contact patterning. Thus, the masks can be placed in contact with the substrate prior to exposing the substrate through the mask. When flexible, deformable electromagnetic radiation sensitive mask materials are used, as discussed above, the mask can be deformed to contact a substrate having a non-planar shape. For example, the mask may be deformed to contact a domed, conical, rectangular, or circular shape. In some examples, the mask may be heated to assist in deforming the mask to the non-planar substrate. It will be understood that the masks of the present invention can be used in conjunction with any suitable patterning system. For example, a system may apply a differential pressure such that the mask substantially deforms in a manner corresponding to at least a portion of the surface of a non-planar part to be patterned.

In some examples, the masks may be reused to expose a plurality of substrates after the step of exposing at least one selected portion of the electromagnetic radiation sensitive mask material to electromagnetic radiation at the patterning wavelength. Thus, the masks may be reusable, and flexible, reusable masks may be provided in embodiments of the present invention.

In accordance with further embodiments, systems are provided. These systems provide integrated patterning of the mask and exposure of at least one substrate through the patterned mask. The system comprises a source for a first and a second electromagnetic radiation; a mask sensitive to the second electromagnetic radiation; a substrate sensitive to the first electromagnetic radiation; and a device in conjunction with the source for the first and second electromagnetic radiation. The device is capable of exposing the mask to the second electromagnetic radiation such that regions that are selectively opaque to the first electromagnetic radiation are formed in the mask. The device is capable of subsequently exposing the substrate to the first electromagnetic radiation through the selectively opaque mask such that portions of the substrate are selectively exposed to the first electromagnetic radiation.

In some examples, at least one additional substrate is exposed to the first electromagnetic radiation through the selectively opaque mask subsequent to the exposure of the substrate sensitive to the first electromagnetic radiation. The device may have more than one source for the first and second electromagnetic radiation. In addition, the device may have a master mask for exposure of the mask to the second electromagnetic radiation. In other examples, the device may have a direct write system that employs the second electromagnetic radiation to pattern the mask. It will be understood that any suitable device capable of patterning the mask using the second electromagnetic radiation may be used.

EXAMPLES

Example 1

Preparation of Electromagnetic Radiation Transparent Flexible Polyurethane Films Transparent urethane rubber films were prepared using the following procedure. Clear Flex 50 and Clear Flex 90 (Smooth-On Inc.), are two-component water white clear aliphatic urethane liquid rubber compounds that have high clarity and resistance to sunlight. The procedure provides about 1% loading. Into a suitable container were placed: 0.3 parts electromagnetic radiation sensitive additive, 2 parts suitable solvent (e.g. chloroform or toluene). The mixture was stirred till dissolved. Next 10 parts Clearflex 50 Part A were added and the mixture was again stirred till dissolved. To this container, 20 parts Clearflex 50 Part B were added and stirred for ~two minutes. The mixture was then degassed briefly to remove any entrained bubbles in a vacuum oven.

Film Preparation: Electromagnetic radiation transparent films were prepared by casting into molds, or depending on the thickness desired, prepared using conventional drawdown bars (Gardner) onto flat substrates. The films were then placed into an oven at ~60 C until curing was complete.

Example 2

Preparation of Electromagnetic Radiation Transparent Thermoplastic Elastomer Films Thermoplastic elastomers, such as those based on hydrocarbon rubbers such as styrene-butadiene-ethylene-styrene (SEBS) block copolymers (e.g. Kraton G 1652, Kraton Polymers), maleic anhydride modified SEBS (Kraton 1901x), and other hydrocarbon rubbers such as polyisoprene, were found to form good films for this application. They can be prepared by thermoplastic compounding methods or solution film casting methods. In a typical solution casting experiment (@1% loading) the following general procedure was followed.

Into a suitable container were placed 0.125 parts UV electromagnetic radiation sensitive additive (e.g. Bisphenol Diacetate (Aldrich) BPDA), 5 parts suitable solvent (e.g. toluene) and the mixture stirred till dissolved. Next 50 parts of a 25 wt % SEBS dissolved in toluene (=12.5 parts SEBS) was added to the container and stirred till mixed thoroughly. The mixture was then degassed either by allowing the entrained air bubbles to escape gradually, or if to be used immediately-degassed using a vacuum oven.

Film Preparation: Films were prepared by the cast film or drawdown film methods described in Example 1 or by a spin coating procedure. In a typical draw-down film formation procedure, a large glass plate (~10"×12") was treated with a small amount of mold release (e.g. Ren RP79-2). Next a 8" wide Universal Blade Applicator (Paul Gardner Co.) with adjustable thickness control was positioned on the glass substrate, and set to the required thickness to provide final films of target thickness, based on the percent solids of the formulation. Next a sufficient aliquot of the polymer resin solution was poured onto the glass plate and the applicator drawndown to level the film. Next the film on glass was placed in a ~60 C oven to cure, and evaporate the solvent. Finally the film was removed from the glass plate and subjected to optical characterization, mask generation, photostability testing, and other physical property testing. Free-standing thin films were prepared using a Specialty Coating Systems SGS/G3-8 Spin Coater (Cookson Electronics). Spin coating parameters were dependent on the viscosity and the desired sample thickness. Representative parameters were: Acceleration time: 10-20 seconds; Spin time: 300-600 seconds; Spin Speed: 400-1000 rpm; Deceleration Time 10-20 seconds.

In a typical spin coating cast film preparation an aliquot of the UV sensitive additive polymer solution was deposited on a 4"-6" diameter Silicon wafer under the conditions described above. Then the film-coated substrate was briefly placed into a oven (~60-90 C) to remove any residual solvent, then removed an allowed to cool, The free-standing flexible transparent polymer film was then readily peeled off the Silicon wafer substrate and subjected to optical characterization, mask generation and photostability testing.

Example 3

Preparation of Multilayer Electromagnetic Radiation Transparent Films

Examples 1 and 2 described methods used to prepare single-layer free standing films containing UV electromagnetic radiation sensitive additives. An extension of this approach is to prepare multilayer films, laminates, or coated flexible substrates. For example, a thin electromagnetic sensitive layer can be deposited on or coextruded on or in between transparent carrier films. The carrier film can be the same or different composition as the UV electromagnetic radiation sensitive layer film. By way of demonstration two-layer films were prepared using the electromagnetic radiation transparent thermoplastic elastomer resin (Example 2) on two commercial films: one styrene-copolymer based (Diamant Film Inc.) and one based on polyvinylidine chloride-polyvinylchloride (PVDC/PVC) copolymer (Saran, Dow Corp.). For the examples shown in FIGS. 26A-34: into a suitable container were placed 0.10 parts Leuco Malachite Green (LMG, Aldrich), 1 part toluene, and the mixture stirred till dissolved. Then, 10 parts of 25 wt % SEBS (Kraton G 1652) in toluene (=2.5 parts polymer) were added to the container and stirred till dissolved. Finally, the resin mixture was coated onto corresponding styrene copolymer (SEBS) or PVDC/PVC copolymer film (~0.5-0.7 mil thick) substrates, using in this case, a spin coating method. The final bilayer films (~2-3 mil thick) were removed and subjected to optical characterization, and mask generation procedures.

Example 4

Mask Generation Procedures

Mask generation was accomplished by the following general procedure: First the freestanding films produced by the methods outlined in Examples 1-3 were taken and sections were mounted onto ~2"×4" thin film substrate holders with ~1"×1" apertures for UV-vis spectral characterization. The initial baseline spectra of the films were determined using a Cary 5000 UV-vis Spectrophotometer. Mask generation was initially performed by irradiating the substrate mounted film samples with a low power UV-lamp (Cole Palmer A-97609-20) at either 254 nm, 302 nm, or 365 nm depending on the electromagnetic radiation sensitive additive involved at a distance of ~3" (or ~1.7 mW/cm2), for selected exposure times. After each exposure time, the sample spectrum was reacquired and then the exposure continued until the sequence was completed. This procedure permitted the determination of the early stage mask generation, as well as the photostability of the final mask at the wavelength used for eventual photolithography (e.g. the Hg i-line 365 nm), since photoresist exposure energy requirements are typically only ~100 mJ/cm2 (<1 minute @~2 mW/cm2). Higher contrast ratio mask samples were prepared by irradiating these initial samples with a higher power UV-lamp (EFOS Ultracure 100ss Plus) equipped with a ~100 watt Hg/Xe arc lamp, an optical filter (~320-500 nm), and a flexible light guide which delivered a total source energy of about 100 mW/cm2 as measured using the photometer sensor (~300-500 nm range) at about 2" distance from the substrate. Typically, the samples were irradiated for about 10 seconds to about 1 minute intervals using a pulsed sequence, and the mask spectrum was reacquired. Contrast ratios were determined as the ratio of the initial percent transmittance divided by the final percent transmittance (To/T).

Example 5

Mask Compositions Based on Photo-Fries Rearrangement Products

A representative compound of this type is a phenolic ester e.g. Bisphenol Diacetate (BPDA). The films depicted in FIGS. 9-15 were prepared at 0.5 wt % BPDA (Aldrich) in a maleic anhydride (MA) modified SEBS resin (Kraton 1901x) using the procedures described in Example 2. Mask generation was conducted @254 nm using the procedures described in Example 4. FIGS. 9-15 illustrate various absorbance measures relating to the masks.

Example 6

Alternative Mask Compositions Based on Electromagnetic Radiation Sensitive/Photo-Fries Rearrangement Products (Urethane/Ureas)

Figure 16:
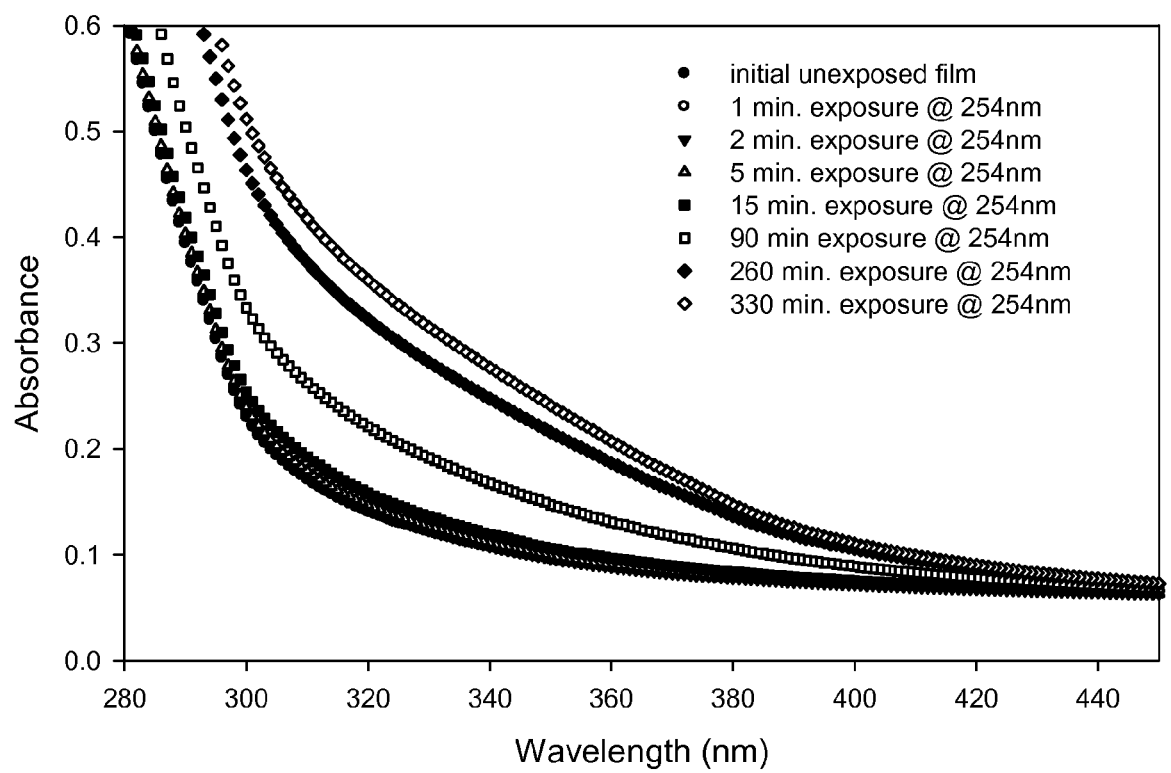
FIG. 16 is a graph of mask generation film spectra for thermoplastic elastomer (TPE) containing electromagnetic radiation sensitive urea compound: diethylamine endcapped MDI.
Figure 17:
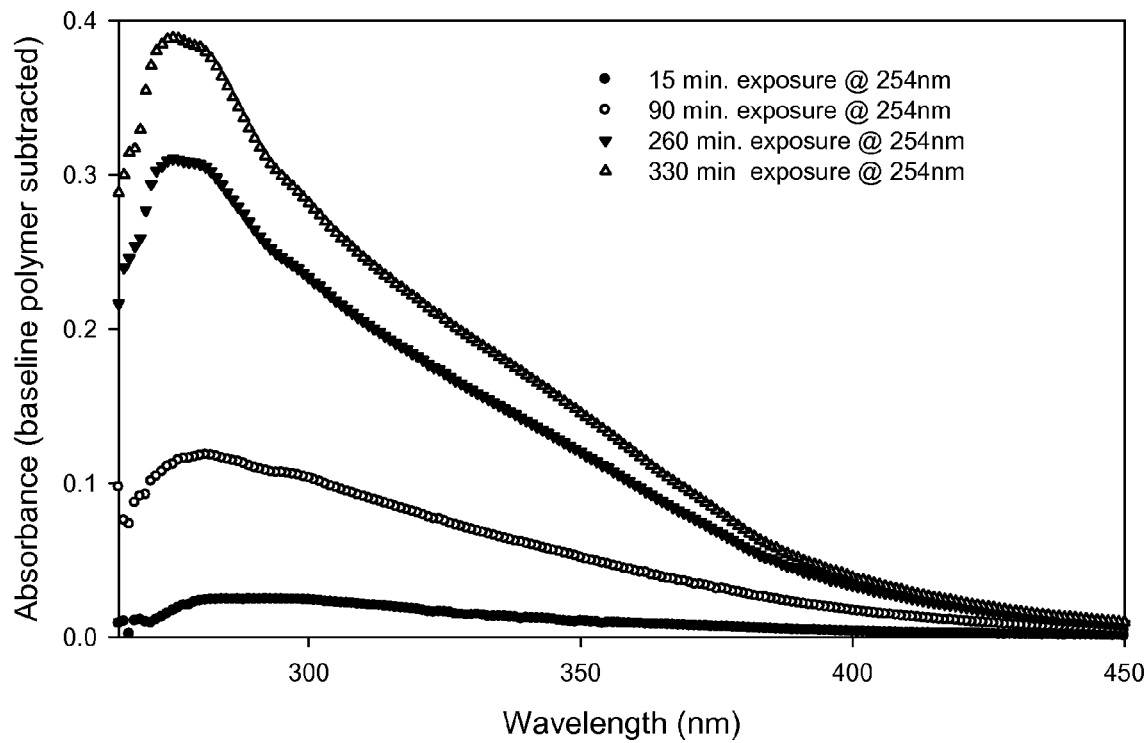
FIG. 17 another graph of mask generation film spectra for thermoplastic elastomer (TPE) containing electromagnetic radiation sensitive urea compound: diethylamine endcapped MDI.

In addition to aromatic esters and related compounds, good results have been obtained with aromatic isocyanate based urethanes, ureas, and carbamates. To illustrate this class, a model compound adduct was prepared by endcapping 4,4'-Diphenylmethane diisocyanate (MDI, 125.13 g/eq.) with Diethylamine ((DEA, Aldrich, 73.14 g/eq.):

Into a suitable container was placed 14 parts MDI and 150 parts toluene and stirred to mix. Next, 7 parts DEA was added drop wise while stirring, forming a white precipitate. Then, 600 parts chloroform was added to form a clear solution at ~2.7% product. This stock solution was used to prepare films in SEBS copolymers as described in Example 2. Mask generation was conducted using the procedure described in Example 4. FIGS. 16-17 show various absorbance measurements of the masks.

Example 7

Mask Compositions Based on Fluoran Leuco Dyes

Leuco dyestuffs, such as fluoran leuco dyes, as represented by Black XV (ESCO) and Pergascript Green I-2GN (Ciba-Geigy) are used in carbonless paper and other applications. Compounds of this type can undergo photo-elimination reactions (e.g. N-ethyl groups) to produce colored products. In a representative example (see FIGS. 20 and 21), mask films containing a relatively high loading (10 wt %) Pergascript Green I-2GN were prepared in Kraton G 1652 (SEBS) using the procedures outline in Example 2. The films remained optically transparent and mask generation was conducted at >300 nm as described in Example 4 using both the low and high power UV lamp sources. FIGS. 20A-22 illustrate percent transmission and contrast ration of masks prepared by this method.

Example 8

Figure 18:
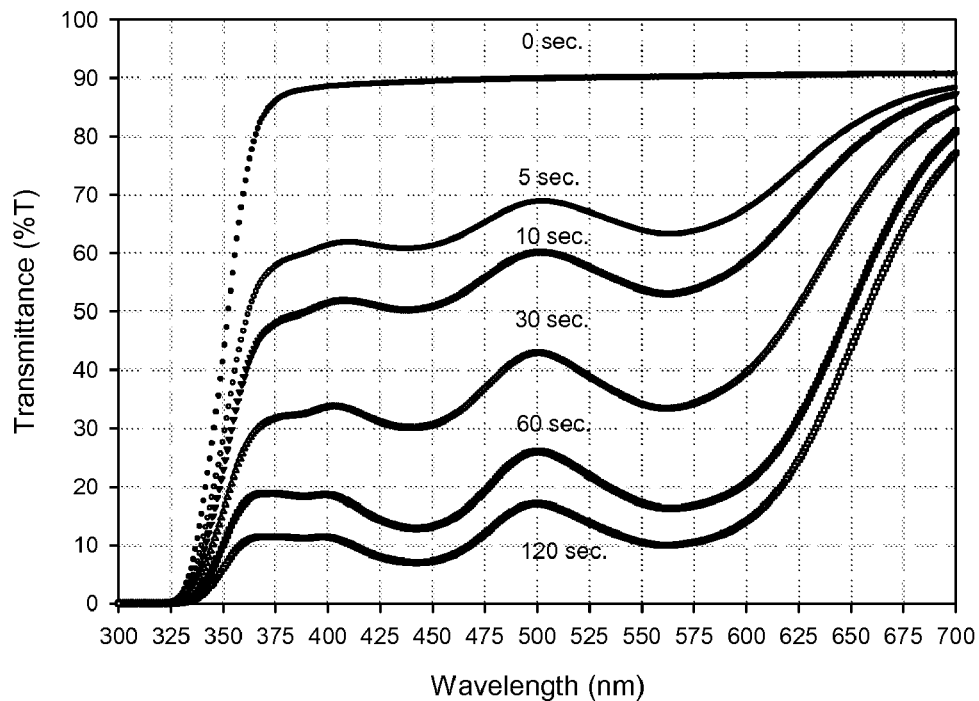
FIG. 18 is a graph of mask generation film spectra for thermoplastic elastomer (TPE) containing electromagnetic radiation sensitive fluoran leuco dye with photo acid generator.
Figure 19:
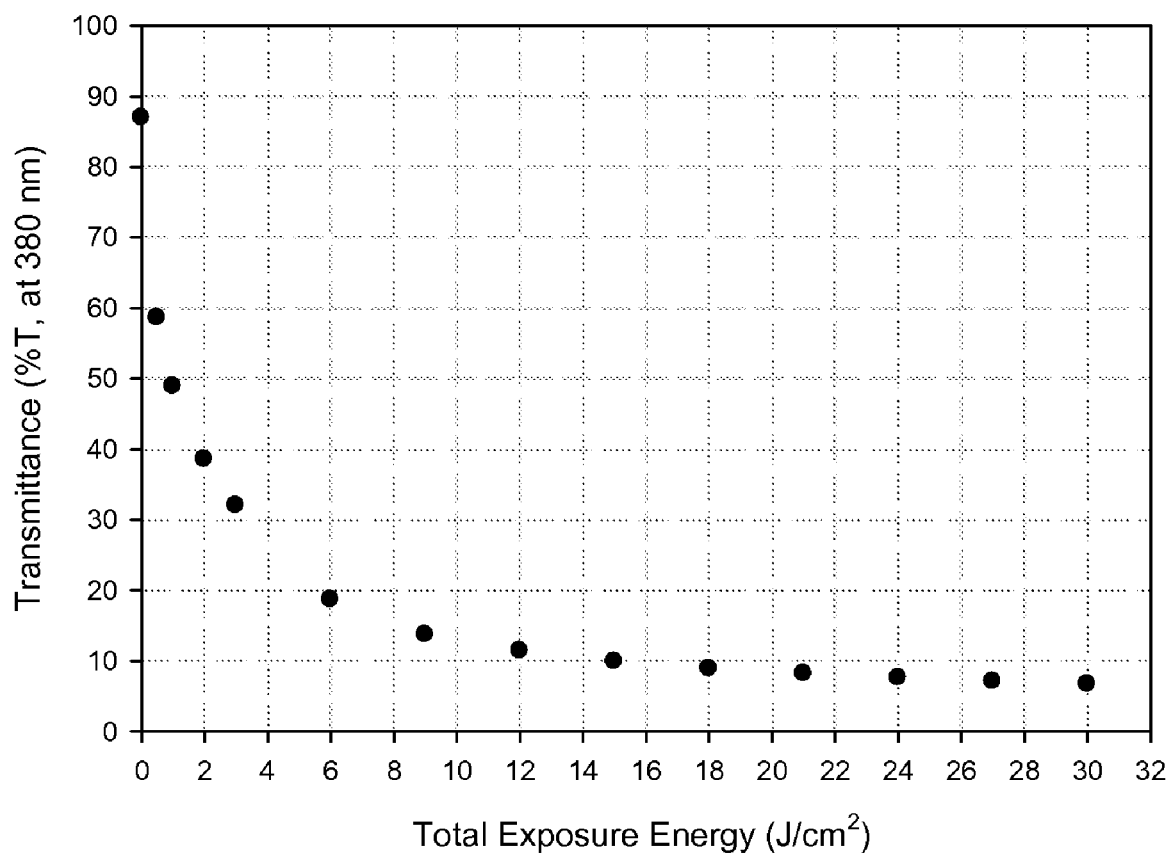
FIG. 19 is a graph of mask generation sensitivity for thermoplastic elastomer (TPE) containing electromagnetic radiation sensitive fluoran leuco dye with photo acid generator.
Figure 20A:
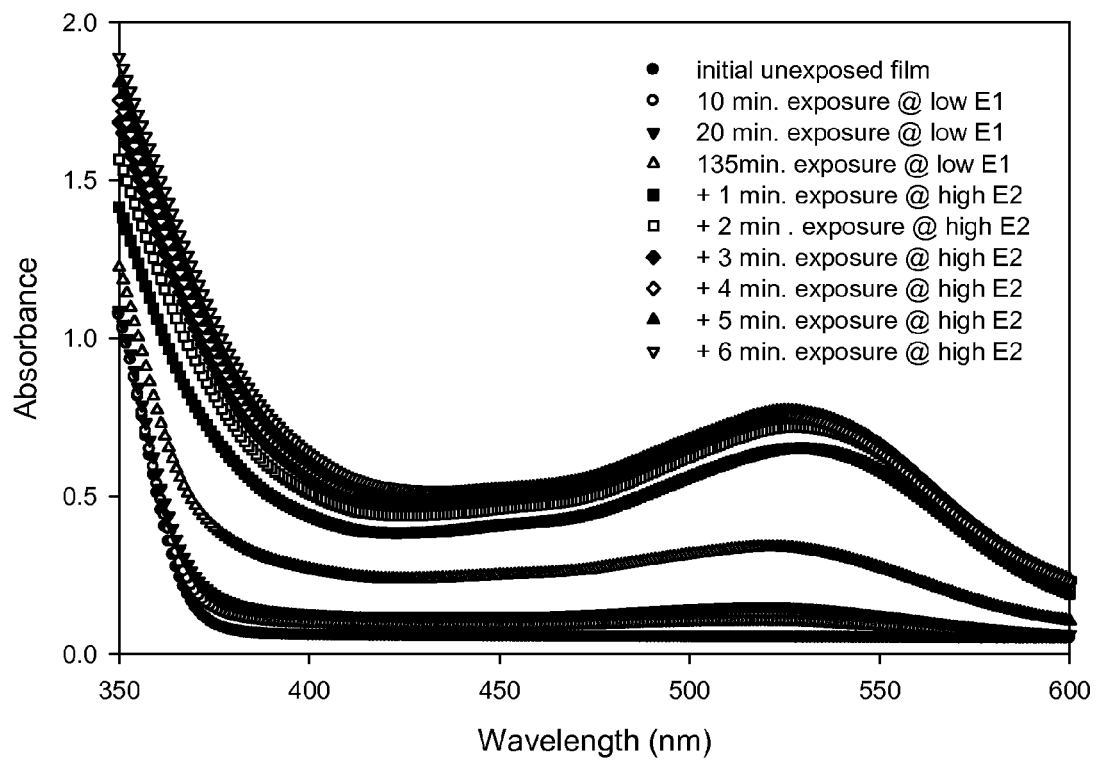
FIGS. 20A-20B are graphs of mask generation film spectra for thermoplastic elastomer (TPE) containing electromagnetic radiation sensitive fluoran leuco dye.
Figure 20B:
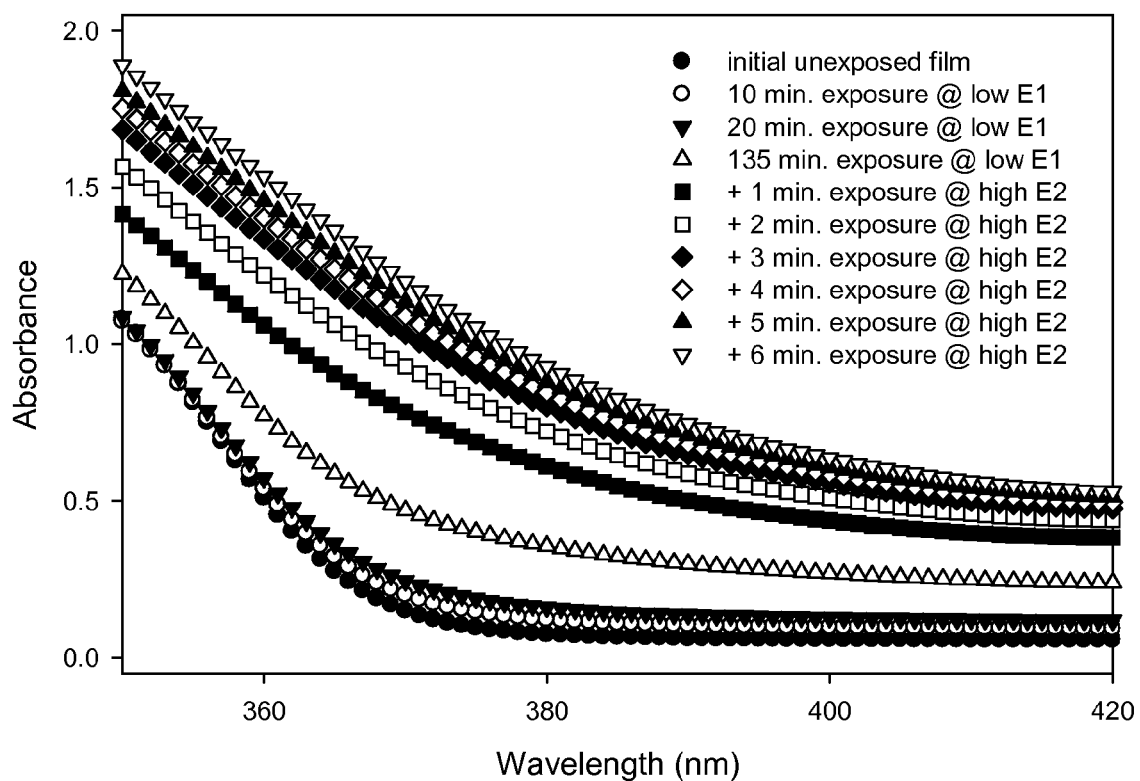
Figure 21:
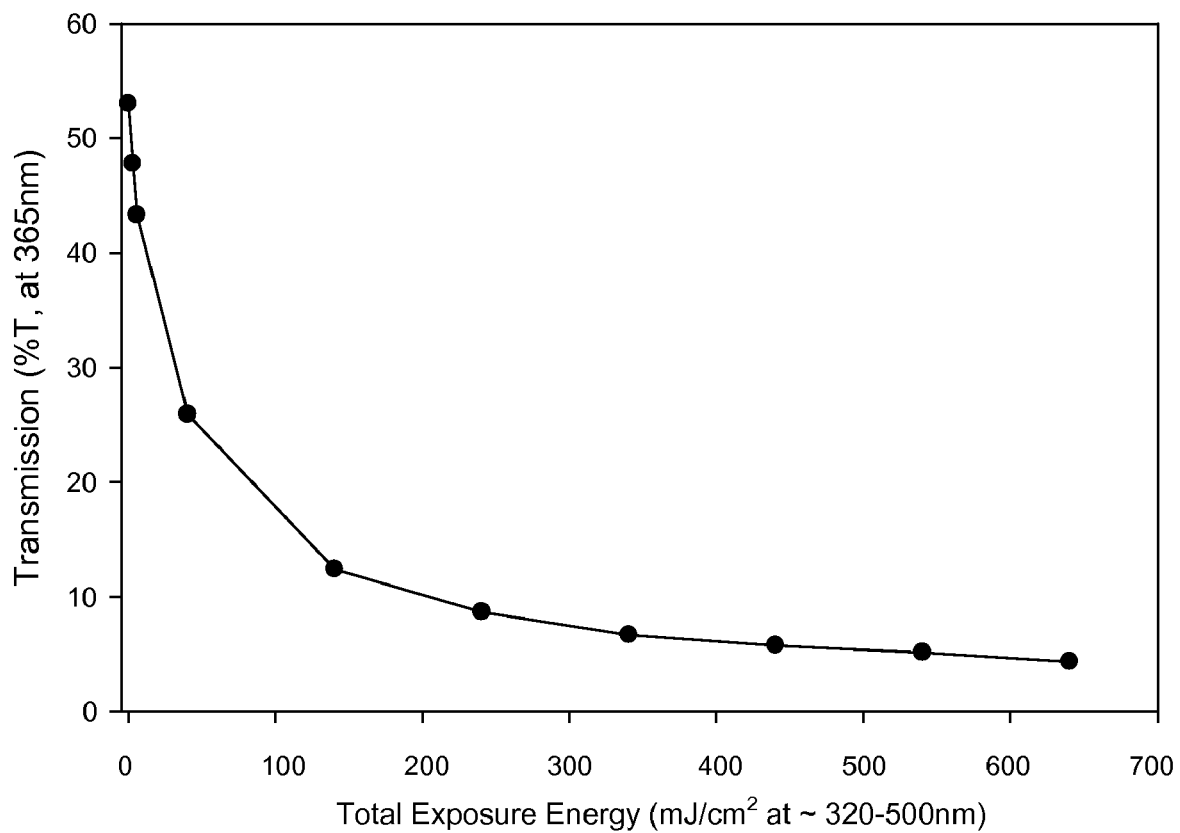
FIG. 21 is a graph of optical transmission during mask generation for thermoplastic elastomer (TPE) containing electromagnetic radiation sensitive fluoran leuco dye.
Figure 22:
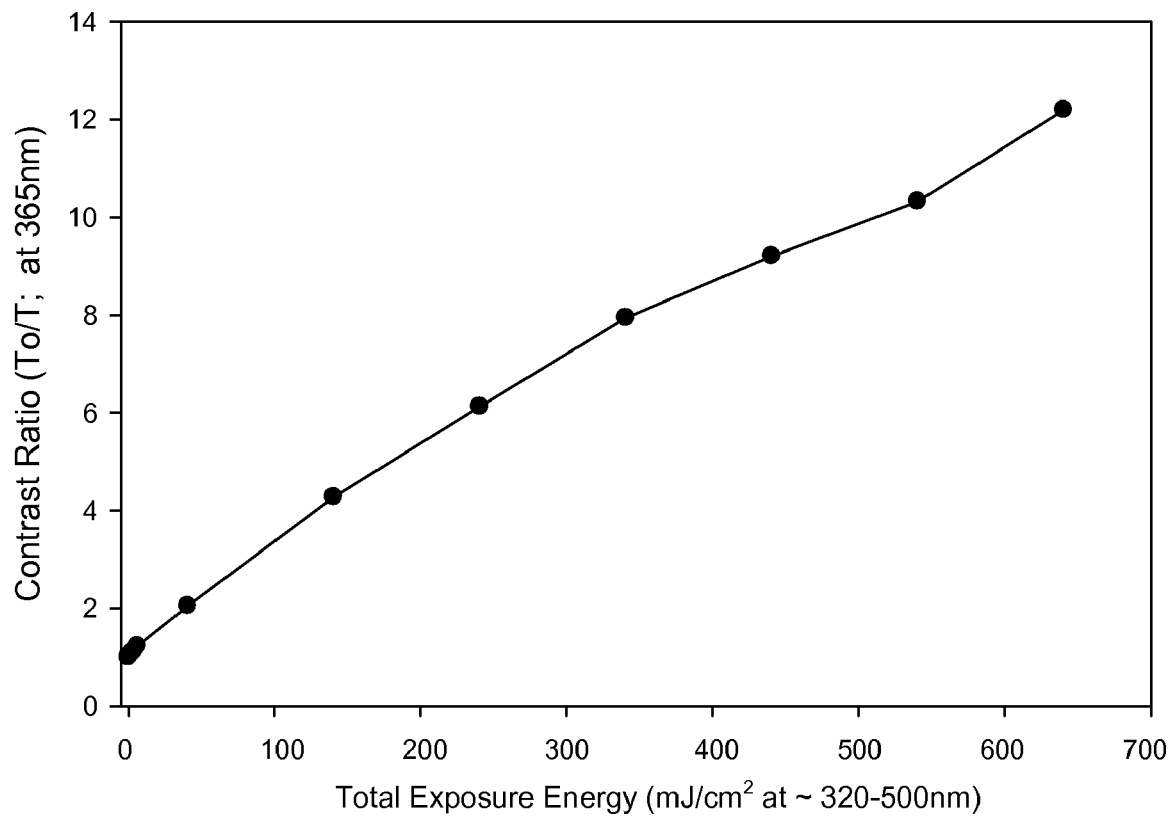
FIG. 22 is a graph of contrast ratio development (at 365 nm) for thermoplastic elastomer (TPE) containing electromagnetic radiation sensitive fluoran leuco dye.
Figure 23A:
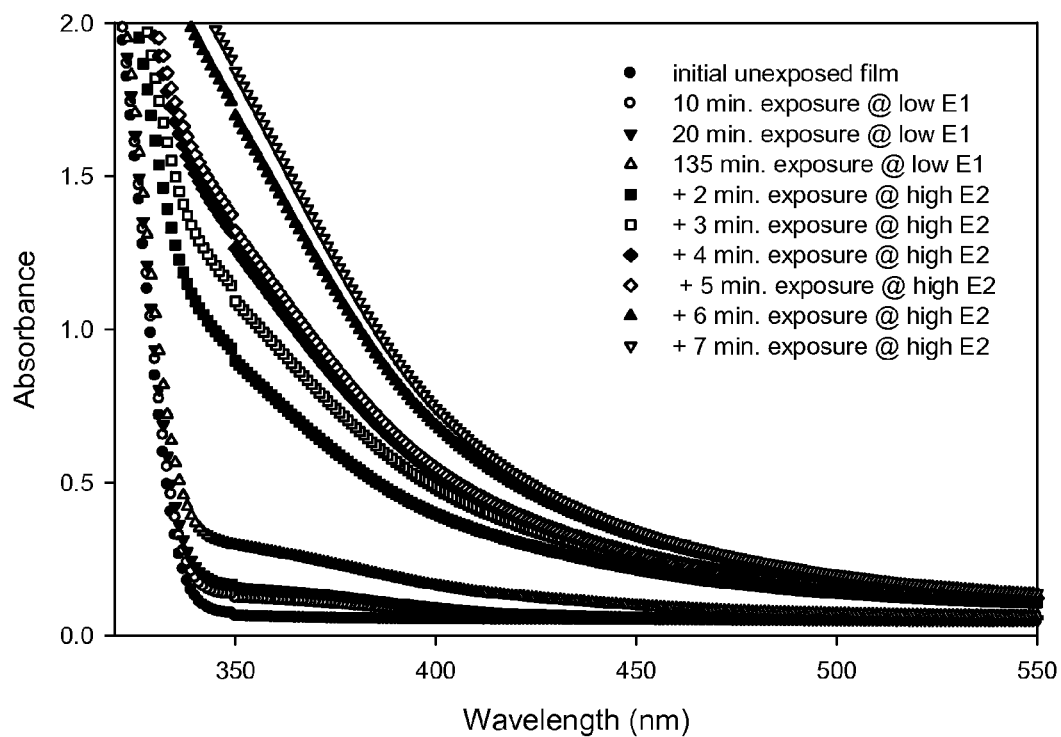
FIGS. 23A-23B are graphs of mask generation film spectra for thermoplastic elastomer (TPE) containing electromagnetic radiation sensitive Triarylmethane leuco dye.
Figure 23B:
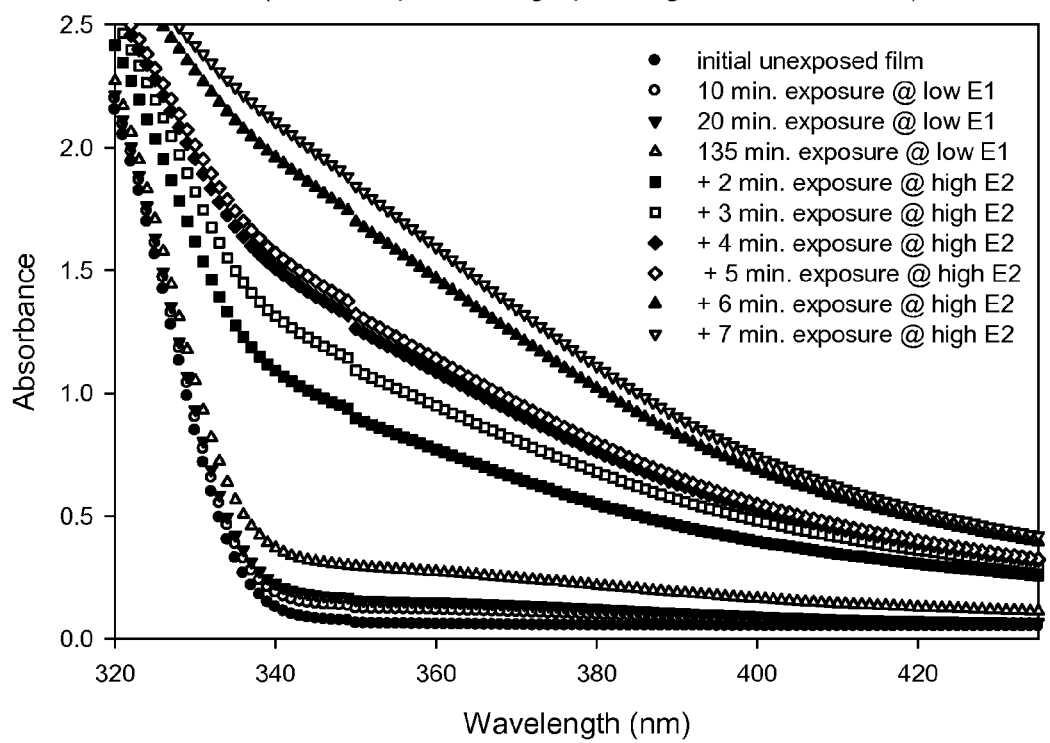
Figure 24:
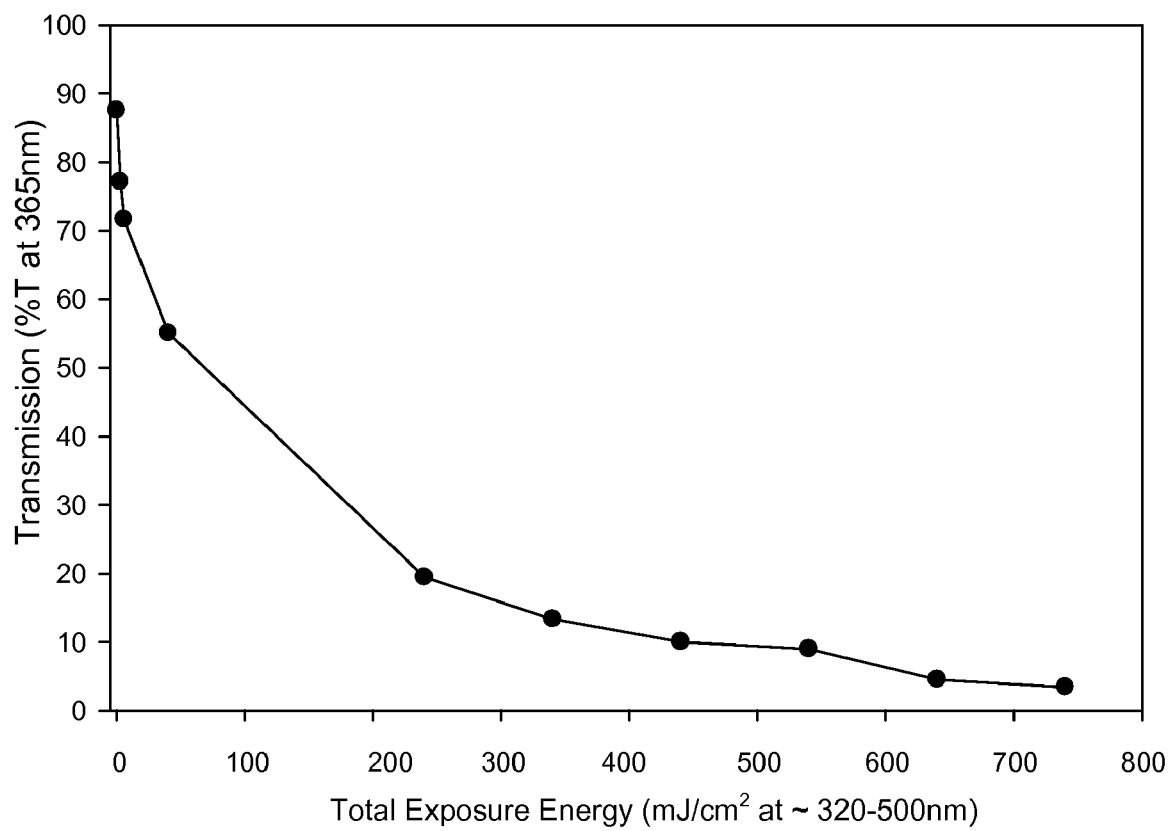
FIG. 24 is a graph of optical transmission (at 365 nm) during mask generation for thermoplastic elastomer (TPE) containing electromagnetic radiation sensitive Triarylmethane leuco dye.
Figure 25:
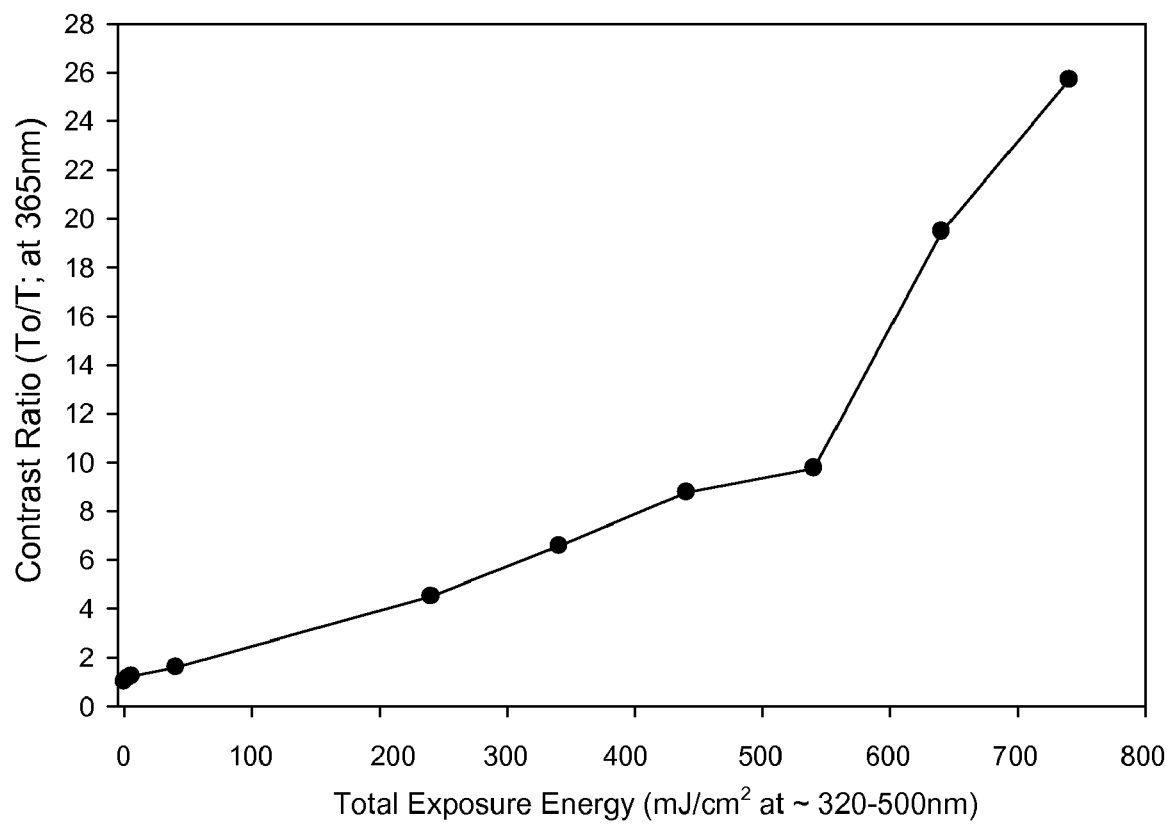
FIG. 25 is a graph of contrast ratio development (at 365 nm) for thermoplastic elastomer (TPE) containing electromagnetic radiation sensitive Triarylmethane leuco dye.

Mask Compositions Based on a Combination of Fluoran Leuco Dyes and Mid-Deep-UV Photo-Acid Generators An alternative electromagnetic radiation sensitive reaction for mask generation uses a combination of a photoacid generator (PAG) specific for the mid-deep-UV (~254 nm-~320 nm) and an acid sensitive Leuco Dye such as but not limited to the Fluoran leuco dyes of Example 6. In this case, the final photoproduct is primarily that of the corresponding open zwitterion form of the leuco dye (e.g. black for Black XV) rather than the Alkyl elimination product (yellow) rate. The rate and degree of color formation at a given mask generation wavelength depends on the particular PAG, and the relative loading of the components. In a representative example, mask films were prepared in SEBS using Black XV (1.0 wt %) and Irgacure PAG 203 (1.0 wt %) (aka CGI-263, Ciba-Geigy) a mid-deep-UV selective (~254 nm-~320 nm) photoacid generator using procedures as described in Example 2. The films remained optically transparent and mask generation was conducted at about 320 nm as described in Example 4. Additional samples with higher contrast ratio were prepared using loadings up to 2 wt % Black XV and up to 4 wt % Irgacure PAG 203. Samples of this film were subjected to photostability testing at 365 nm and produced no color formation at this wavelength. Samples prepared with corresponding near-UV (~365 nm) photoacid generators, such as Irgacure PAG 121 substituted in the formulation produced marked color change (as expected) when tested at 365 nm. FIGS. 18-19 illustrate absorbance of masks produced by this method.

Example 9

Mask Compositions Based on Triarylmethane Leuco Dyes

Useful masks can also be produced using a different class of leuco dyes based on triaryl methane such as Leuco Malachite Green (LMG), and Leuco Crystal Violet. In this case the photoreaction involves a hydrogen elimination (oxidation) (see FIG. 4D). By way of illustration mask film samples were prepared at up to 10 wt % loading LMG in SEBS (Kraton G 1652) as described in Example 2. The films were subjected to mask generation at ~300-500 nm using the procedures described in Example 4. FIGS. 23A-25 illustrate the percent transmission and contrast ratios of mask prepared in this way.

Figure 26A:
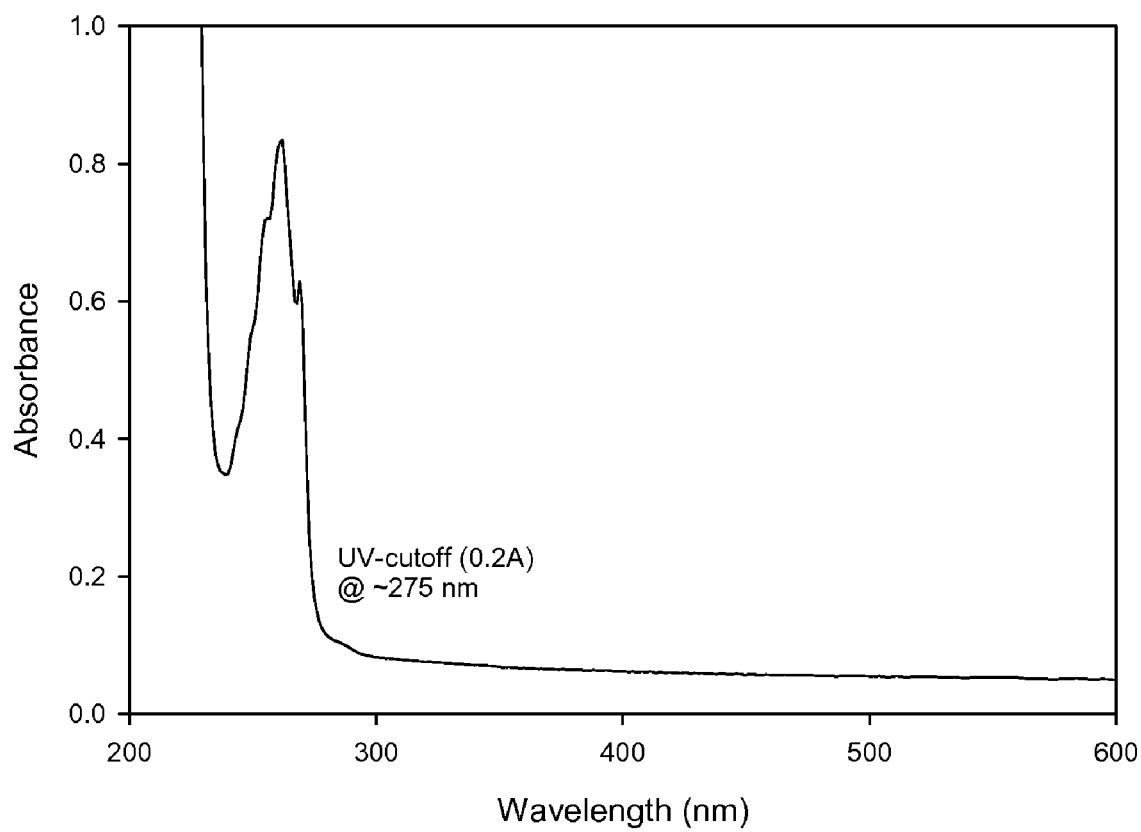
FIGS. 26A-26B are graphs of UV-Vis absorbance of control transparent flexible substrate film (Diamant Inc.)
Figure 26B:
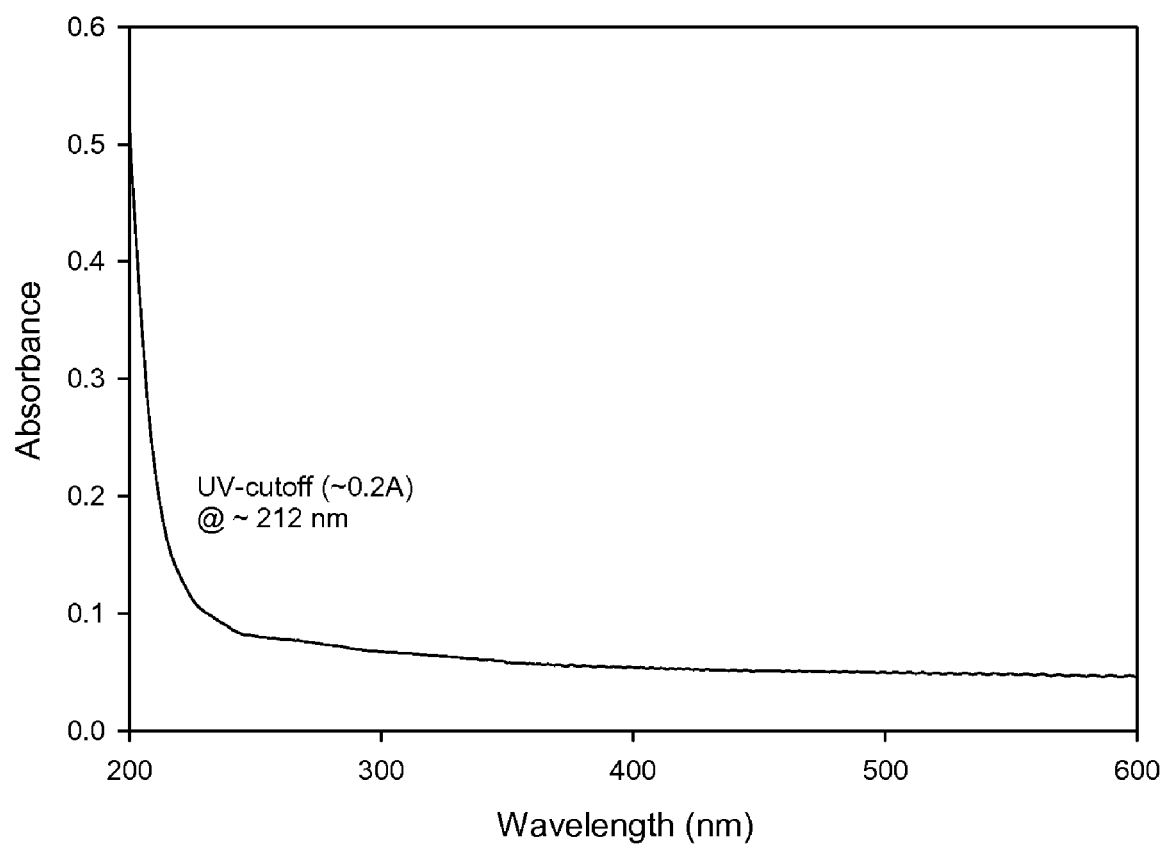
Figure 27:
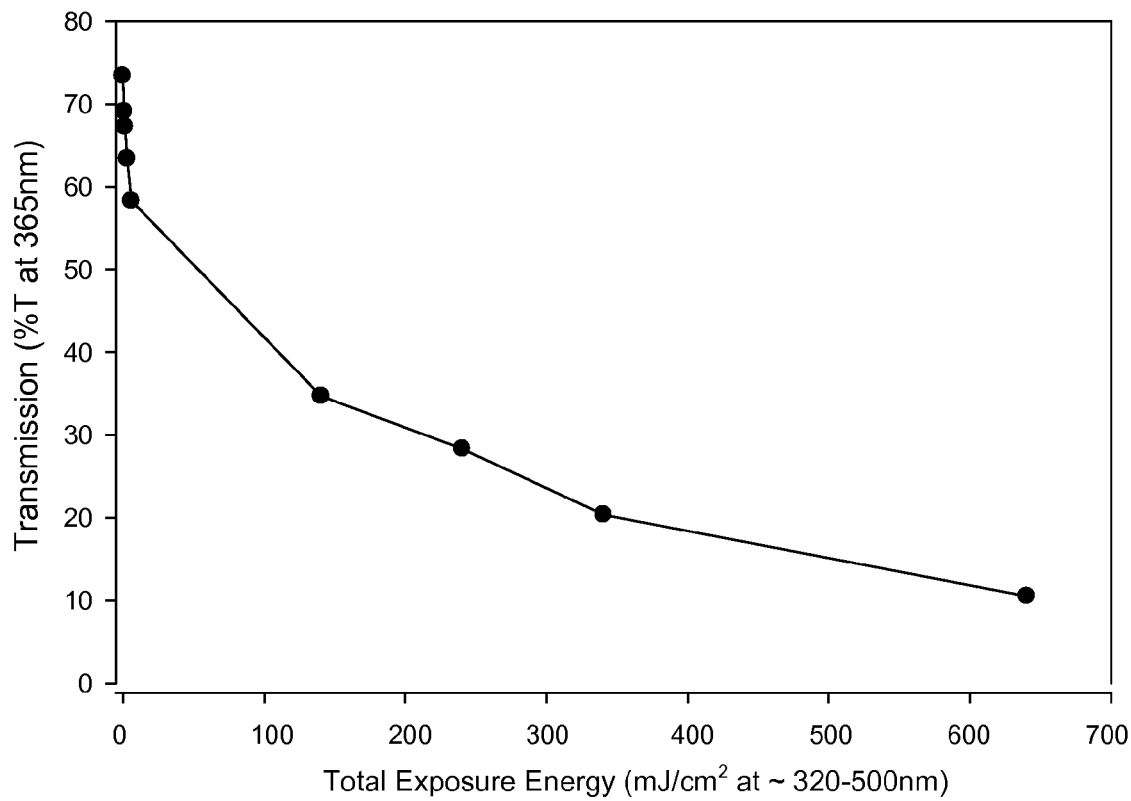
FIG. 27 is a graph of optical transmission (at 365 nm) during mask generation for leuco malachite green film/coating on a transparent flexible substrate film (Diamant Inc.)
Figure 28:
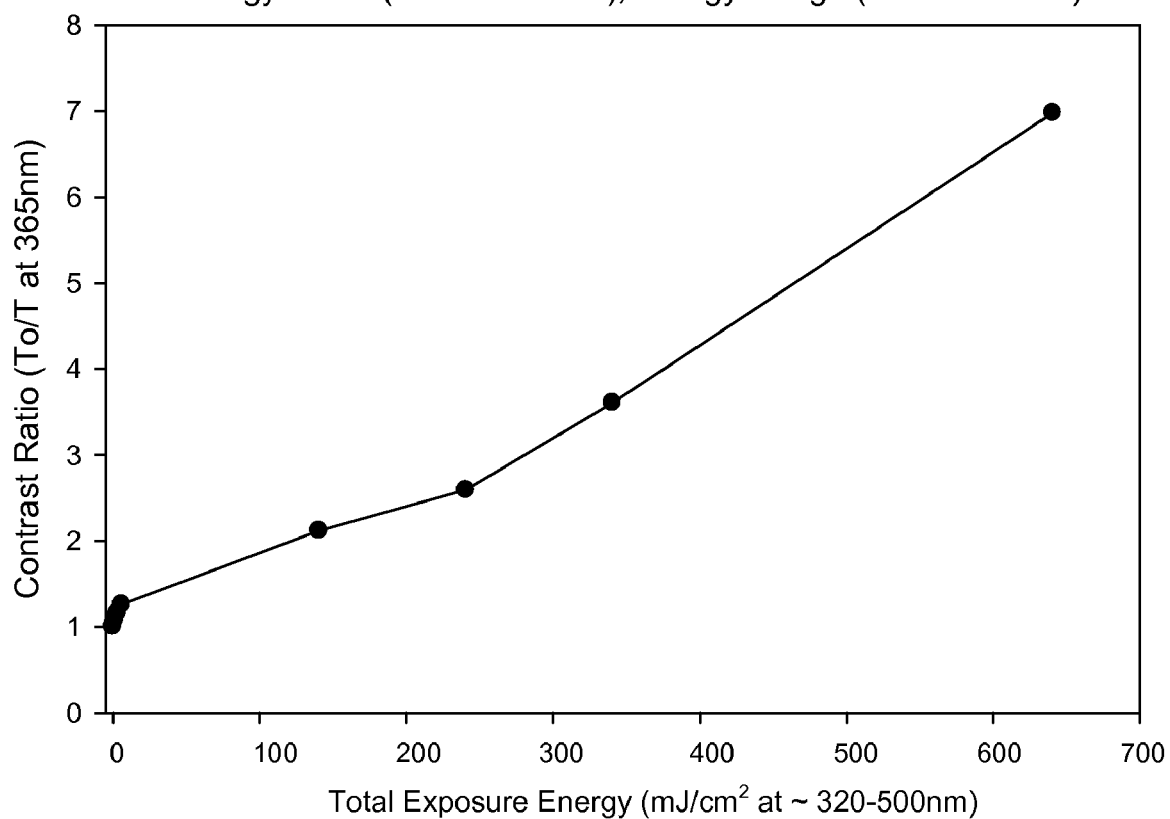
FIG. 28 is a graph of contrast ratio development (at 365 nm) for leuco malachite green film/coating on a transparent flexible substrate film (Diamant Inc.)
Figure 29:
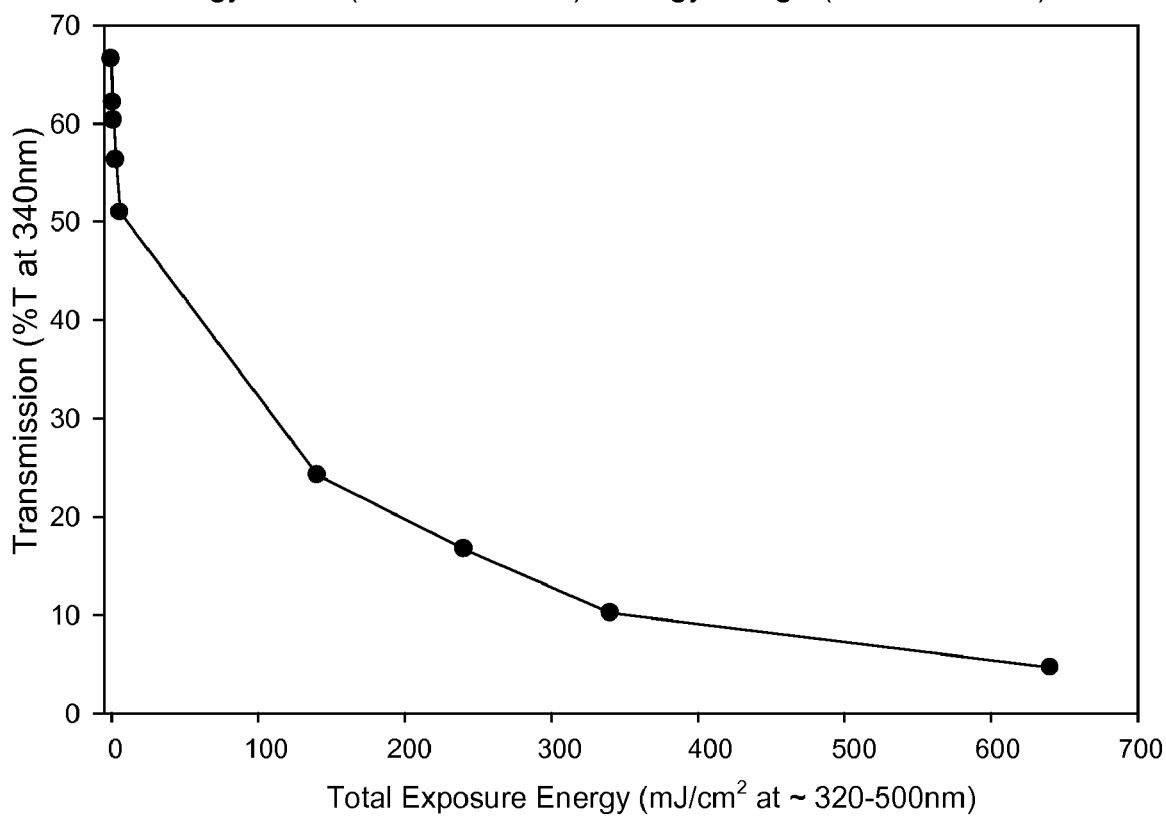
FIG. 29 is a graph of optical transmission (at 340 nm) during mask generation for leuco malachite green film/coating on a transparent flexible substrate film (Diamant Inc.)
Figure 30:
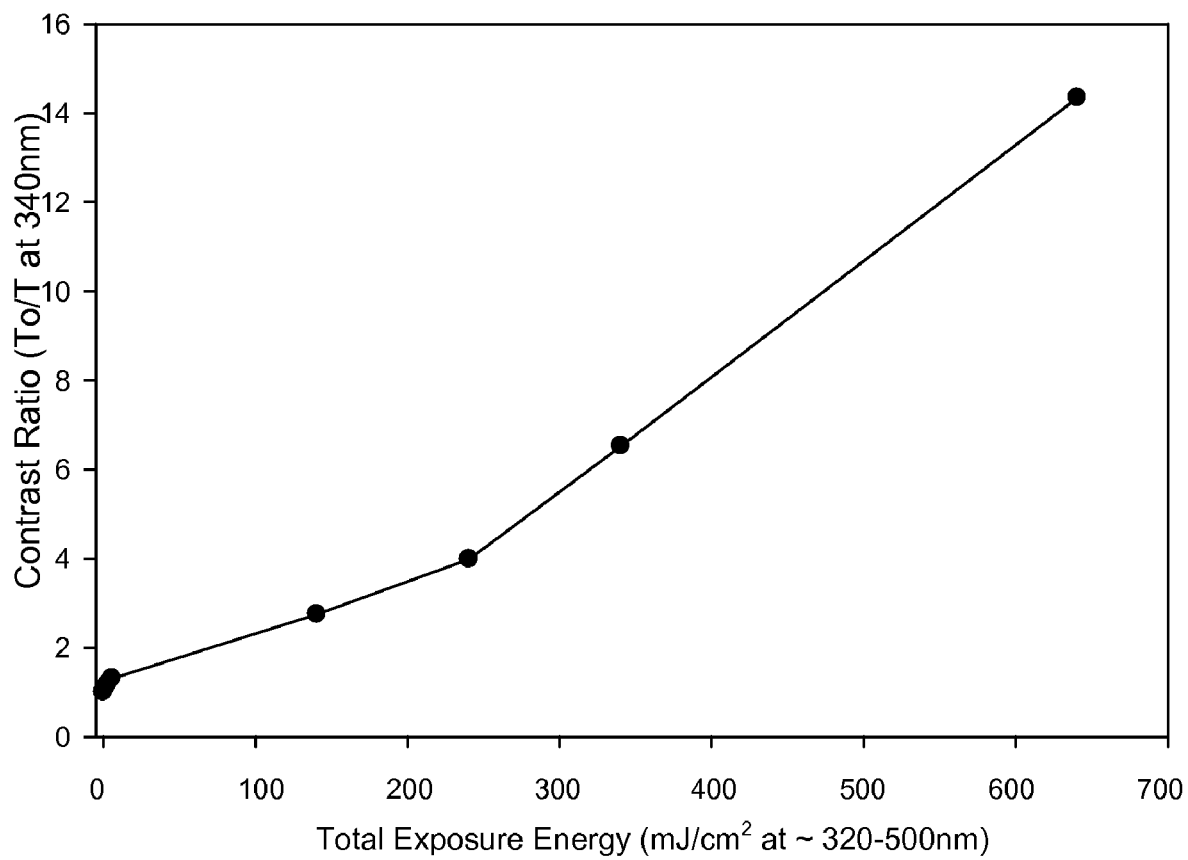
FIG. 30 is a graph of contrast ratio development (at 340 nm) for leuco malachite green film/coating on a transparent flexible substrate film (Diamant Inc.)
Figure 31:
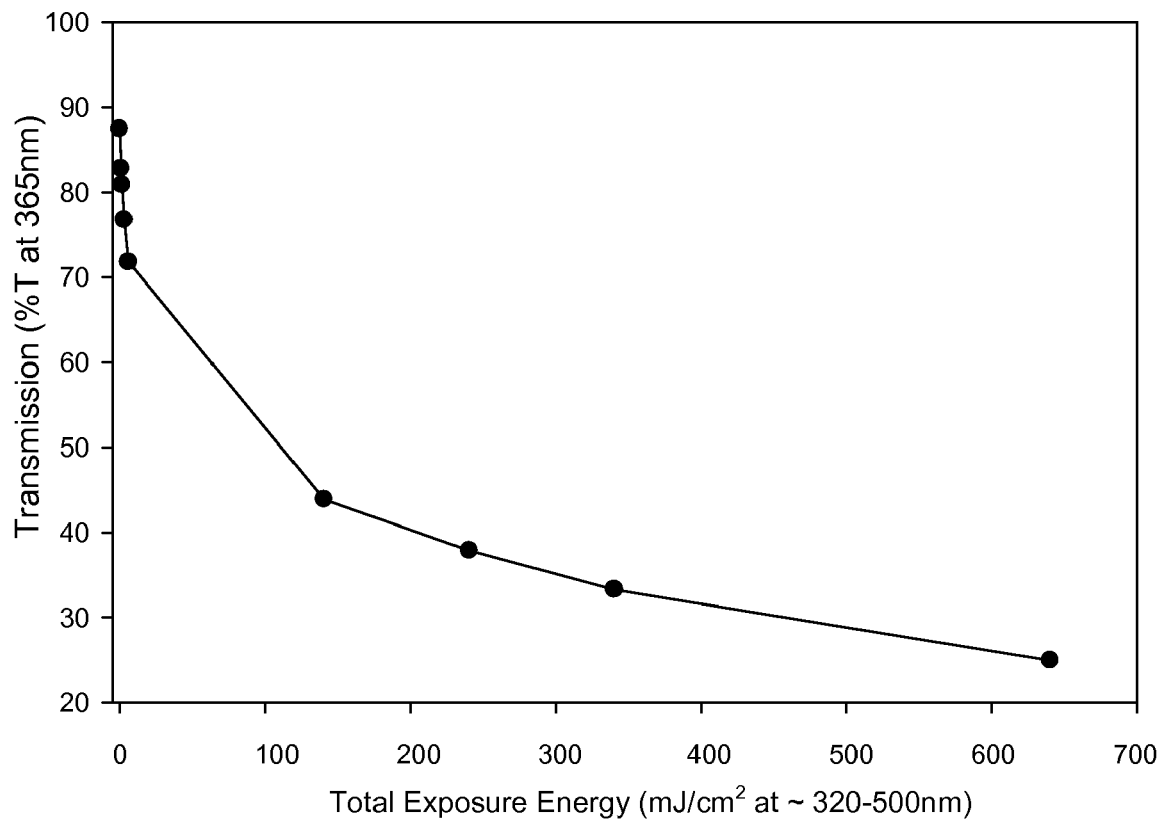
FIG. 31 is a graph of optical transmission (at 365 nm) for leuco malachite green film/coating on a transparent flexible substrate film (Saran)
Figure 32:
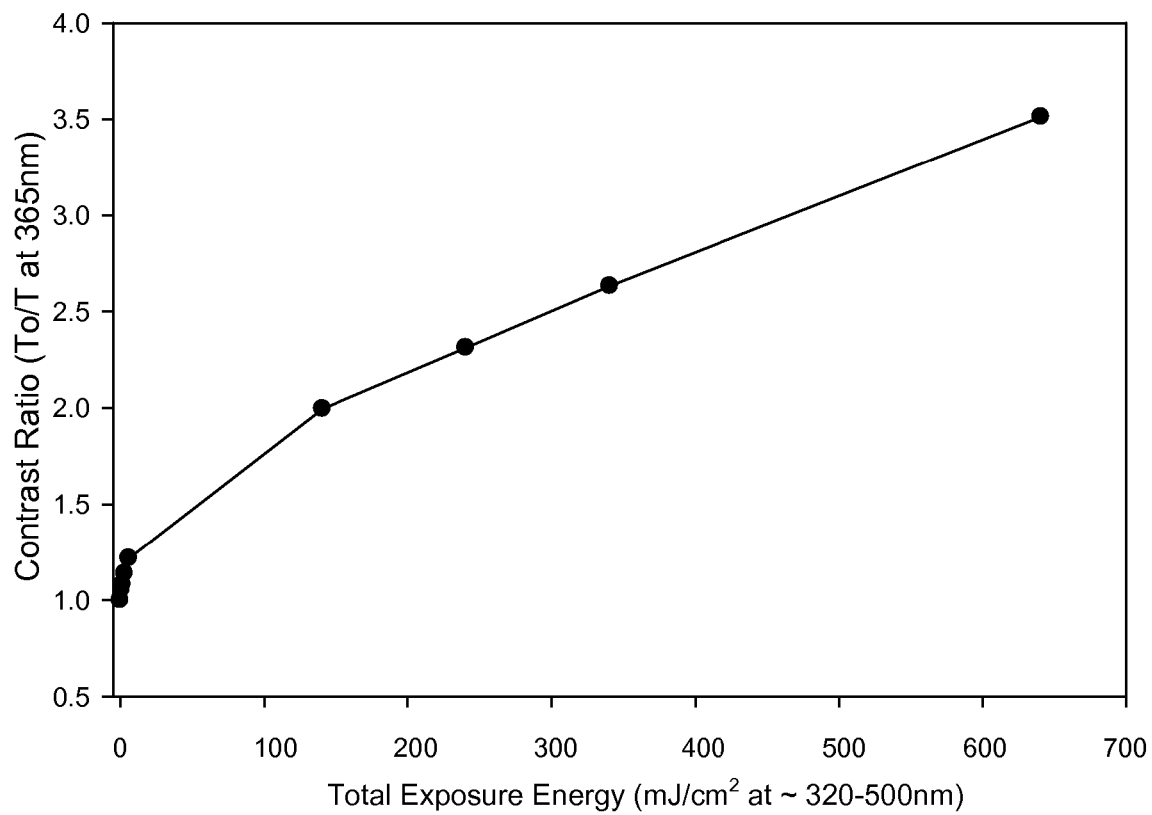
FIG. 32 is a graph of contrast ratio development (at 356 nm) for leuco malachite green film/coating on a transparent flexible substrate film (Saran)
Figure 33:
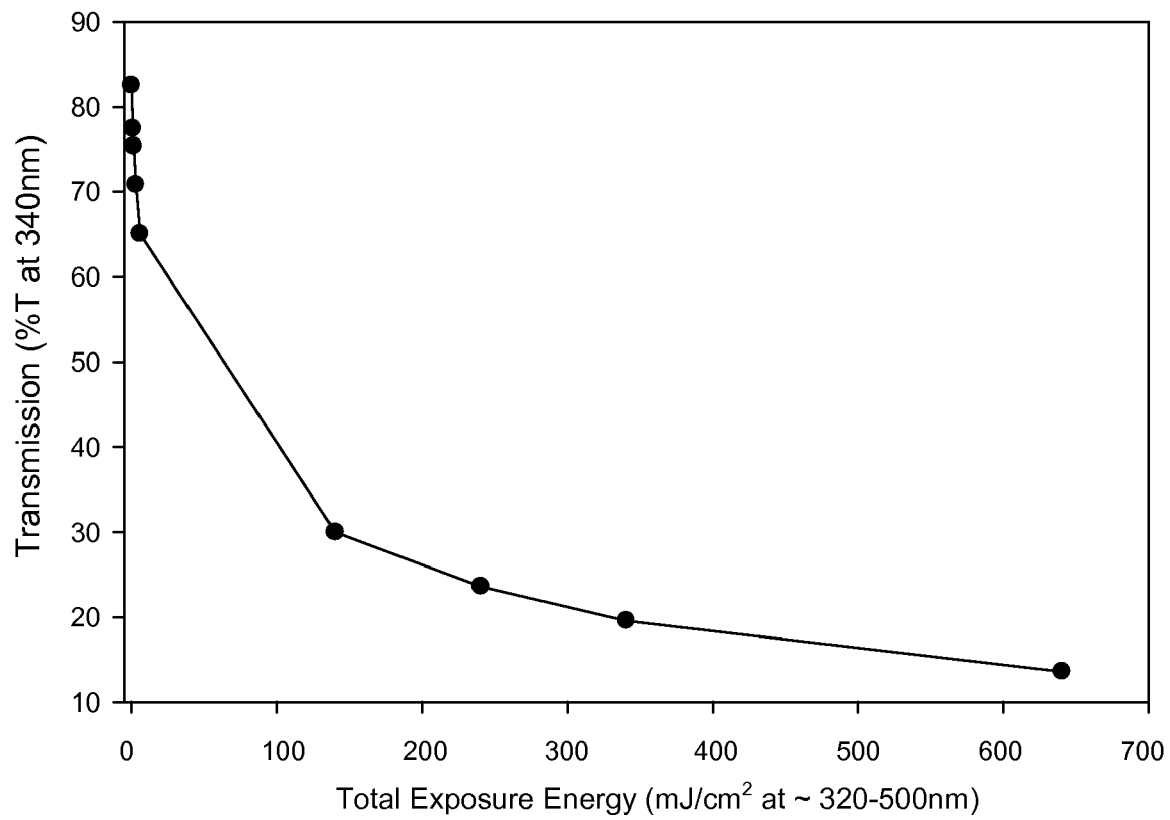
FIG. 33 is a graph of optical transmission (at 340 nm) during mask generation for leuco malachite green film/coating on a transparent flexible substrate film (Saran)
Figure 34:
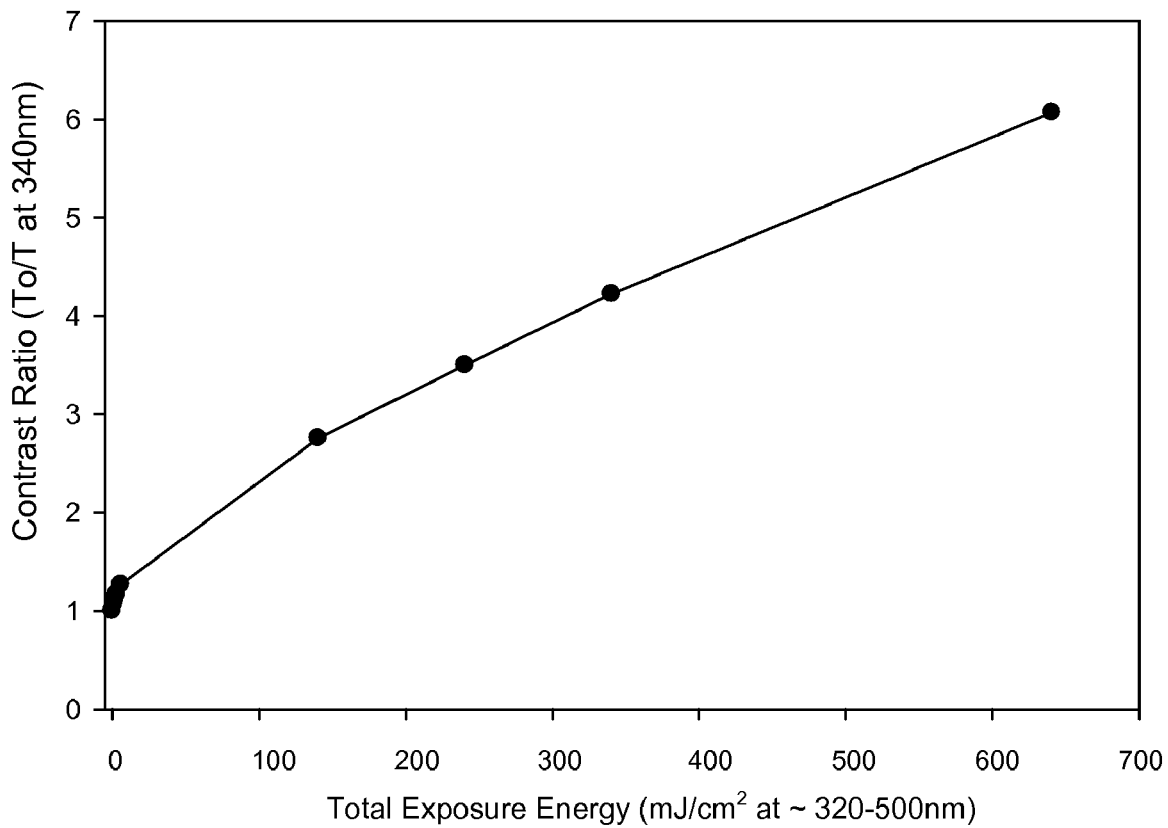
FIG. 34 is a graph of contrast ratio development (at 340 nm) for leuco malachite green film/coating on a transparent flexible substrate film (Saran).

Further examples of this type were prepared at 4 wt % loading in the same base polymer and deposited on both styrene-copolymer (Diamant) and PVDC/PVC copolymer (Saran Wrap®) using procedures as described in Example 3 (see FIGS. 26-33), producing multilayer films with high optical transmittance and good contrast ratio at both 340 nm and 365 nm wavelength regions. Comparative examples prepared using a related compound Crystal Violet Lactone, produced no color change under the same conditions. FIGS. 26A and 26B illustrate the absorbance of Diamant and Saran Wrap®. FIGS. 27-34 illustrate percent transmission and contrast ratios of masks prepared in accordance with this procedure.

Figure 36A:
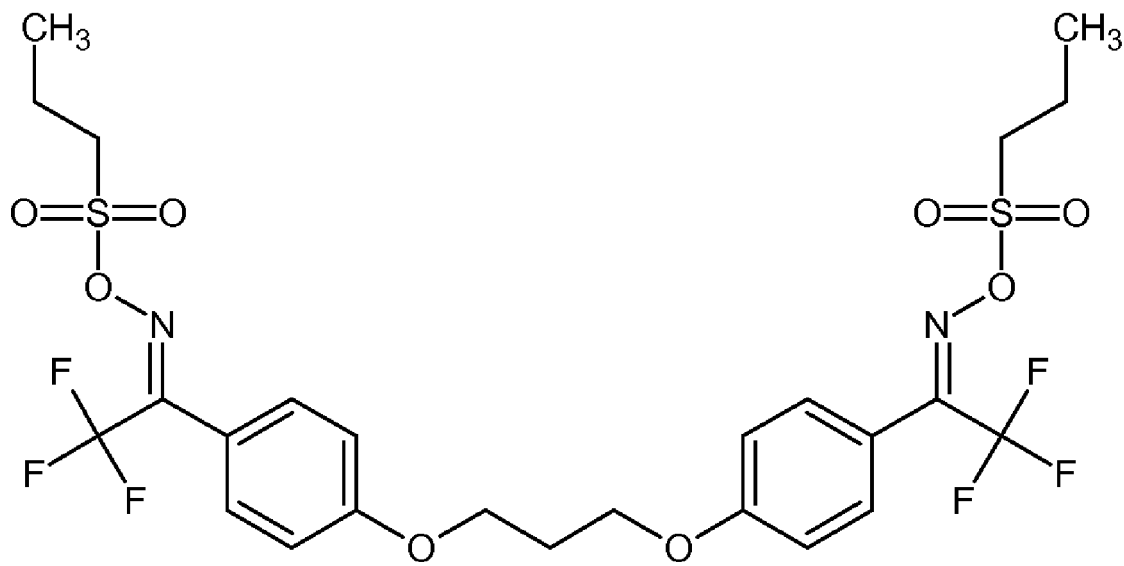
FIGS. 36A-36B are structures of certain photo-acid generators.
Figure 36B:
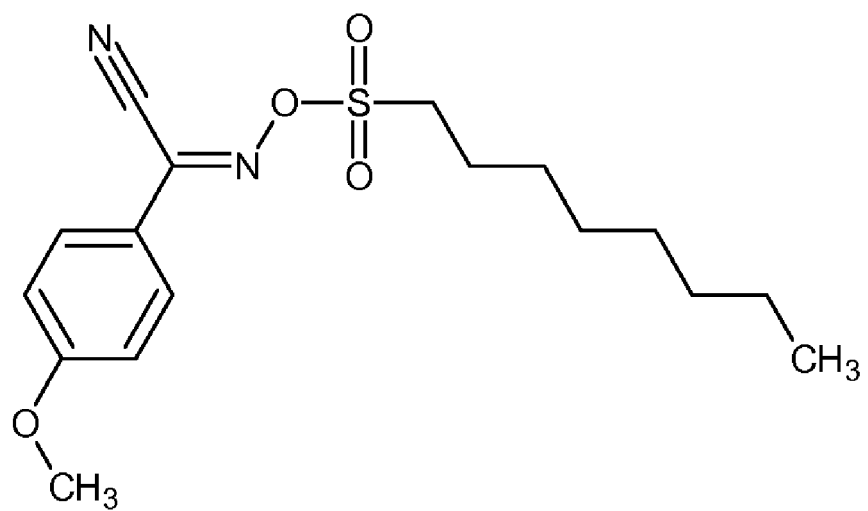
Figure 37:
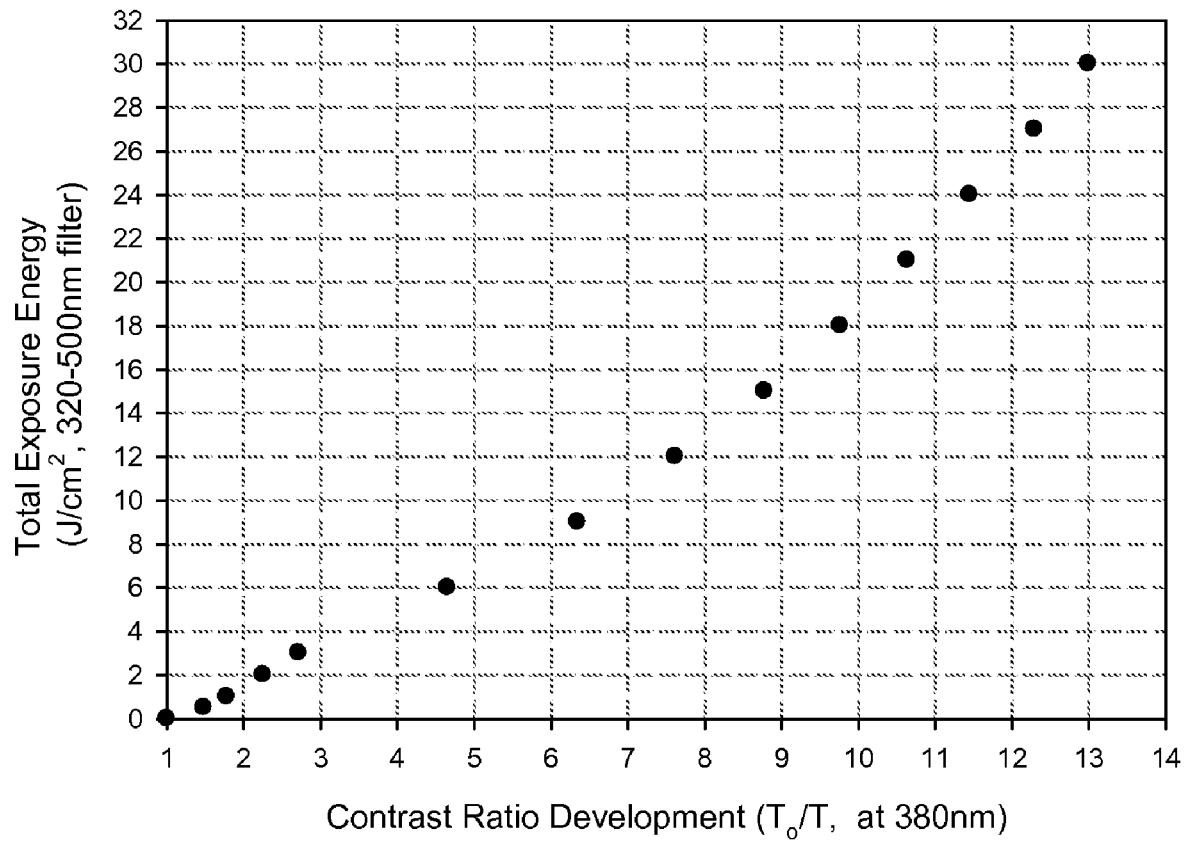
FIG. 37 is a graph of mask generation sensitivity contrast ratio development.
Figure 38:
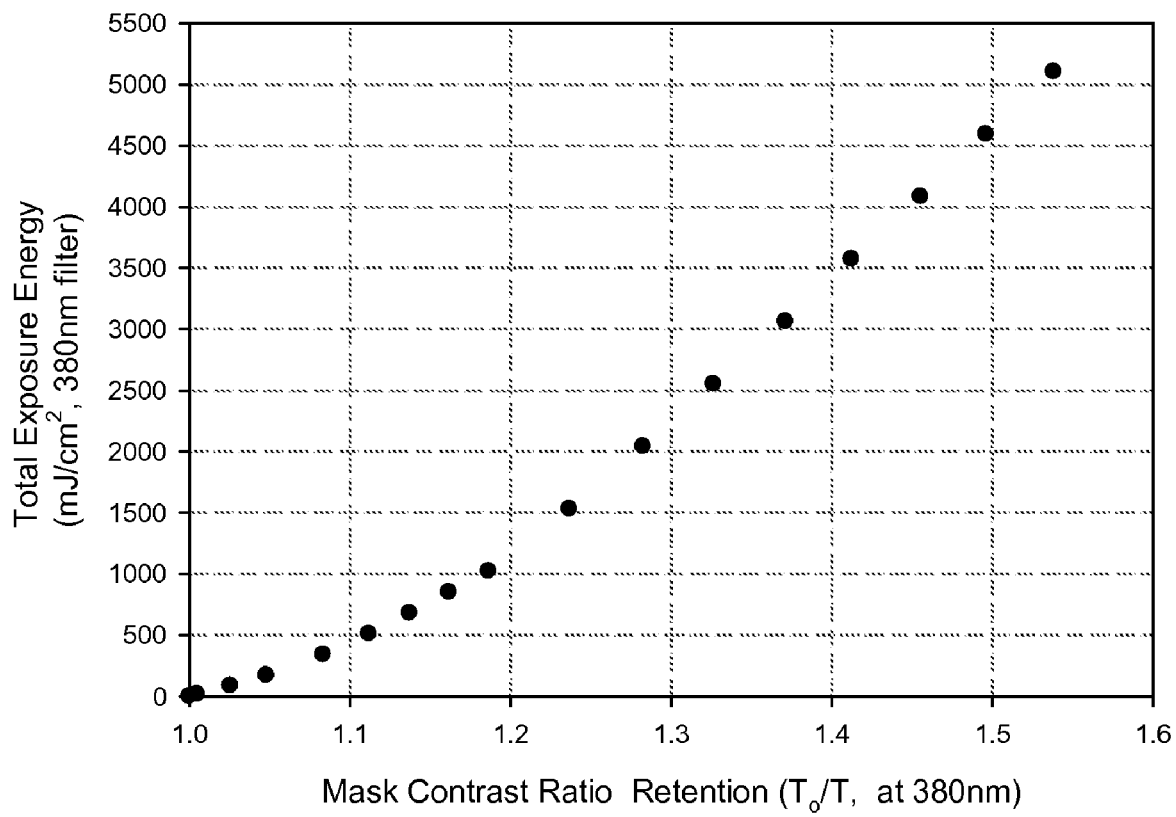
FIG. 38 is a graph of mask photolithographic stability mask contrast ratio retention.
Figure 39:
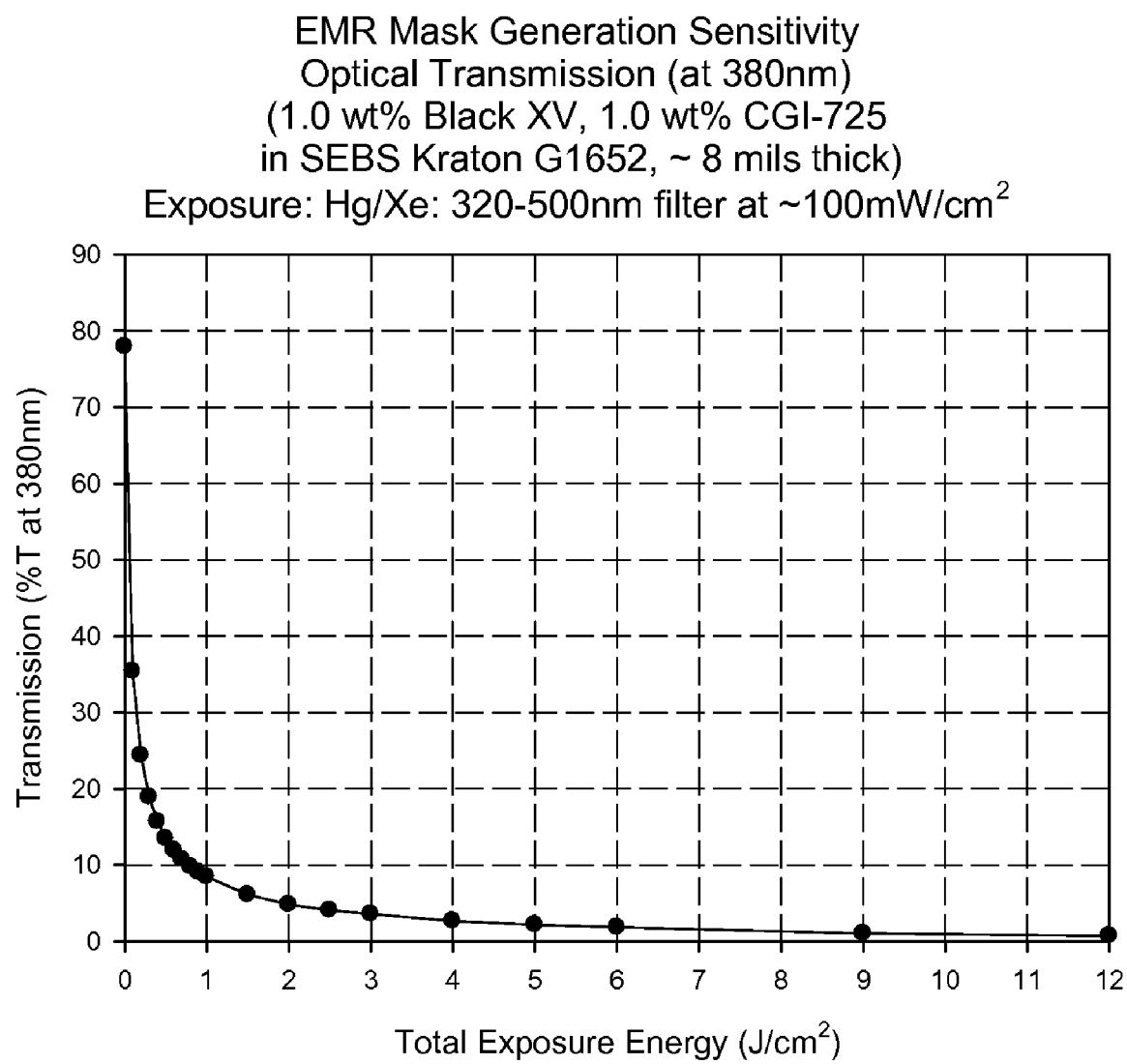
FIG. 39 is a graph of mask generation sensitivity optical transmission.
Figure 40:
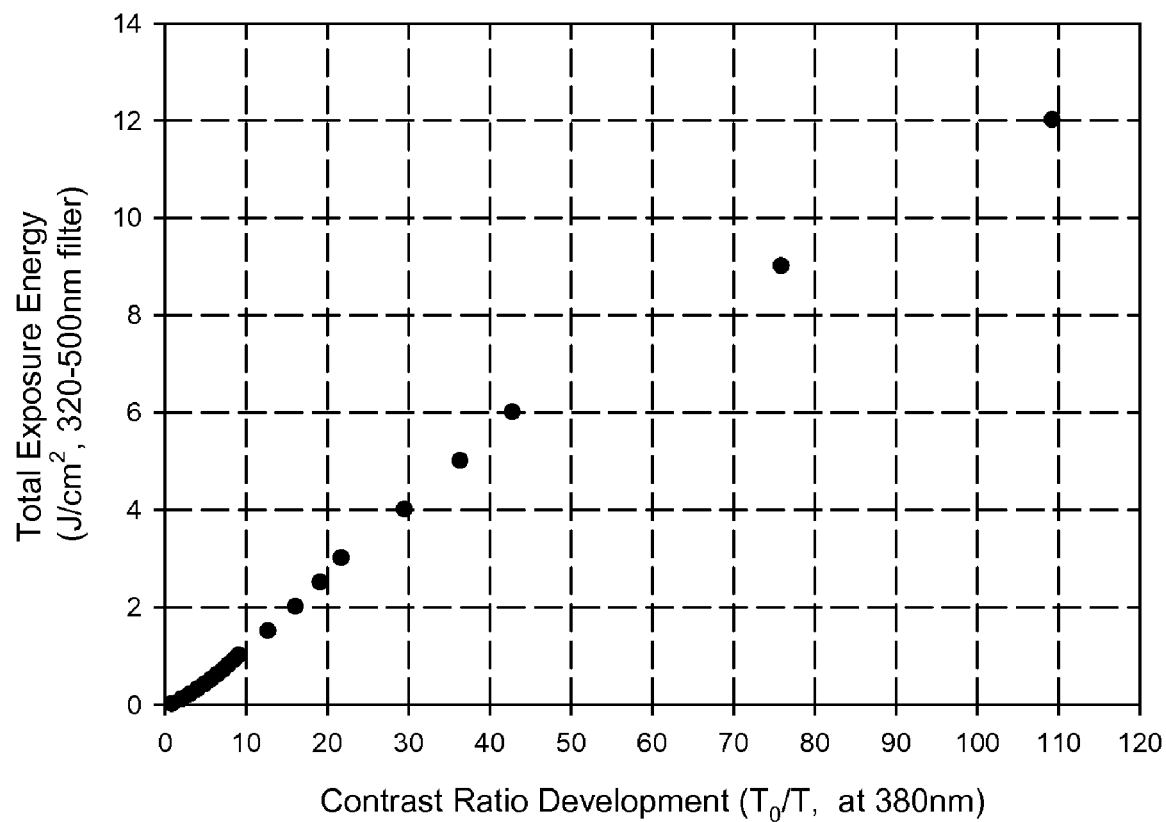
FIG. 40 is another graph of mask generation sensitivity contrast ratio development.

Yet further examples of this type, an alternative mid-UV sensitive photo-acid generator may be used. An alternative electromagnetic radiation sensitive composition with higher EMR mask generation sensitivity comprises substitution of Irgacure PAG 203 (see FIG. 36A.) with a mid-UV sensitive photo-acid generator such as Ciba CGI 725 (see FIG. 36B). This composition exhibits high thermal stability (Td ~210 C), high sensitivity (~270 nm-~370 nm, insensitive >~370 nm) and good compatibility in mask polymer films. In this example, compositions containing ~1.0 wt % CGI 725 with ~1.0 wt % Black XV were prepared using procedures as described in Example 8. Films prepared in this way were tested for EMR mask generation by irradiation in the ~320 nm-500 nm range as described previously. Contrast ratios of greater than 100:1 ($T_0/T$) were achieved at total exposure energies of <12 J/cm$^2$ as compared to a contrast ratio of ~7.5:1 for the films of Example 8 at the same thickness and exposure energy. Contrast ratios of ~10:1 required only ~1 J/cm$^2$. Results for this example are presented in FIGS. 37-40.

Example 10

Figure 35:
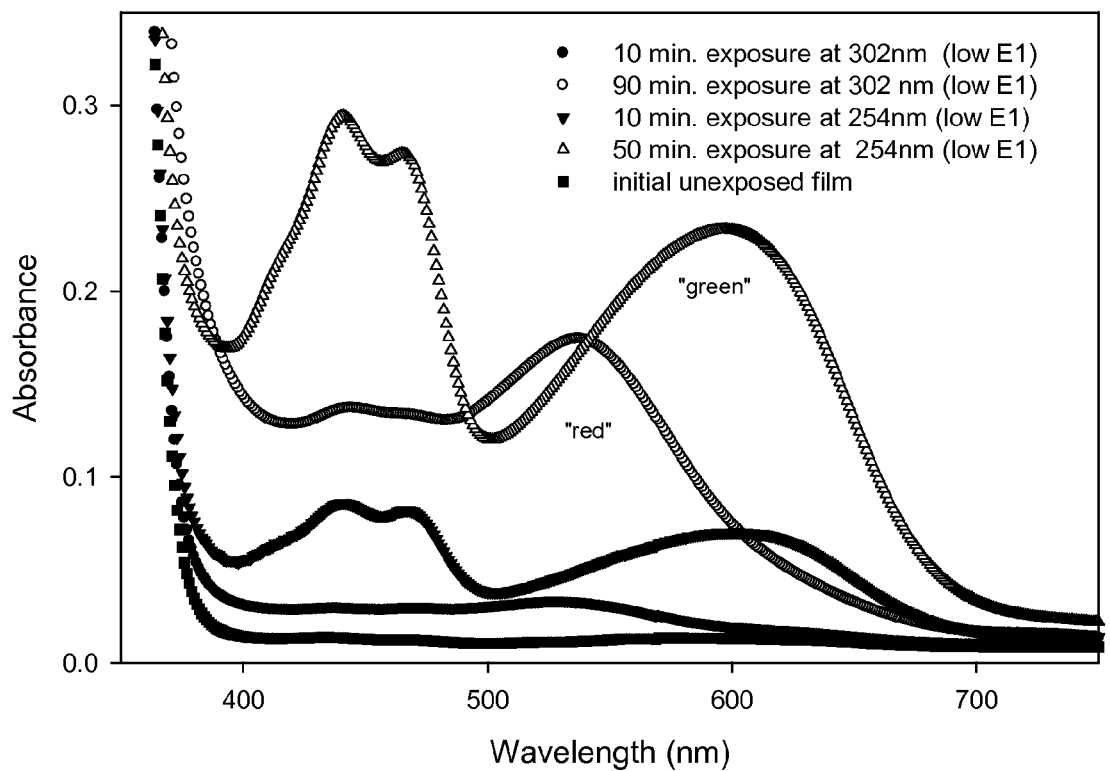
FIG. 35 is a graph of mask film generation spectra for polyvinylchloride (PVC) containing electromagnetic radiation sensitive fluoran leuco dye with wavelength selective mask formation mechanisms.

Mask Compositions Based on a Combination of Fluoran Leuco Dyes in Electromagnetic Radiation Sensitive Matrix Polymers Exposing chlorine containing polymers such as polyvinyl chloride (PVC), polyvinylidine chloride (PVDC), or ethylene chlorotrifluorethylene (ECTFE) to heat (above 100 C), ultraviolet light, or gamma radiation, can cause elimination of hydrochloric acid (HCl) from the polymer backbone through a dehydrochlorination reaction. As such, an alternative electromagnetic radiation sensitive reaction for mask generation uses a combination of an acid generating electromagnetic radiation sensitive polymer and an acid sensitive Leuco Dye such as but not limited to the Fluoran leuco dyes of Example 7. In this case, depending on the wavelength of the electromagnetic radiation 254 nm or 302 nm, the final photoproduct is primarily that of the corresponding open zwitterion form of the leuco dye (e.g. green for Pergascript I-2GN) rather than the Alkyl elimination product (red), respectively. The rate and degree of color formation at a given mask generation wavelength depends on the particular polymer, and the relative loading of the components. In a representative example, mask films were prepared in polyvinyl chloride (PVC) using Pergascript I-2GN (5 wt %). using procedures as described in Example 2. The films remained optically transparent and mask generation was conducted at 254 nm and 302 nm as described in Example 4 (see FIG. 35).

The present invention should not be considered limited to the specific examples described above, but rather should be understood to cover all aspects of the invention. Various modifications, equivalent processes, as well as numerous structures and devices to which the present invention may be applicable will be readily apparent to those of skill in the art.

It will be obvious to those skilled in the art that various changes may be made without departing from the scope of the invention, which is not to be considered limited to what is described in the specification.

What is claimed is:

1. A mask comprising an electromagnetic radiation sensitive mask material, wherein:
    a first percentage of electromagnetic radiation at a first wavelength is transmitted through the electromagnetic radiation sensitive mask material prior to the exposure of the electromagnetic radiation sensitive mask material to electromagnetic radiation at a second wavelength;
    a second percentage of electromagnetic radiation at the first wavelength is transmitted through at least a portion of the electromagnetic radiation sensitive mask material after the at least a portion of the electromagnetic radiation sensitive mask material is exposed to electromagnetic radiation at the second wavelength; and
    the electromagnetic radiation sensitive mask material is suitable to define features on a substrate at the first wavelength after the exposure of the at least a portion of the electromagnetic radiation sensitive mask material to electromagnetic radiation at the second wavelength to form patterns defining the features in the electromagnetic radiation sensitive mask material.

2. The mask as claimed in claim 1 wherein the first wavelength and the second wavelength are the same.

3. The mask as claimed in claim 1 wherein the first wavelength and the second wavelength are different.

4. The mask as claimed in claim 1 wherein the second percentage of electromagnetic radiation at the first wavelength comprises a gradient of electromagnetic radiation.

5. The mask as claimed in claim 1 wherein the electromagnetic radiation sensitive mask material comprises a polymer matrix comprising an electromagnetic radiation sensitive polymer.

6. The mask as claimed in claim 5 wherein the electromagnetic radiation sensitive mask material comprises at least one acid sensitive additive.

7. The mask as claimed in claim 5 wherein the polymer matrix comprises a modified polymer, and wherein the modified polymer is modified such that the modified polymer has at least one electromagnetic radiation sensitive portion.

8. The mask as claimed in claim 1 wherein the electromagnetic radiation sensitive mask material comprises a polymer matrix having at least one electromagnetic radiation sensitive additive.

9. The mask as claimed in claim 8 wherein the electromagnetic radiation sensitive mask material comprises a polymer matrix having at least one acid sensitive additive.

10. The mask as claimed in claim 8 wherein the at least one electromagnetic radiation sensitive additive is dispersed in the polymer matrix.

11. The mask as claimed in claim 8 wherein the at least one electromagnetic radiation sensitive additive is infused in the polymer matrix.

12. The mask as claimed in claim 8 wherein the at least one electromagnetic radiation sensitive additive is disposed on the polymer matrix.

13. The mask as claimed in claim 8 wherein the at least one electromagnetic radiation sensitive additive undergoes a chemical reaction at the second wavelength.

14. The mask as claimed in claim 8 wherein the at least one electromagnetic radiation sensitive additive is selected from compounds that undergo a photo elimination reaction, a photo rearrangement reaction, a photo oxidation reaction, and a photo-fries product generation reaction.

15. The mask as claimed in claim 1 wherein the electromagnetic radiation sensitive mask material comprises a single layer.

16. The mask as claimed in claim 1 wherein the electromagnetic radiation sensitive mask material comprises more than one layer.

17. The mask as claimed in claim 1 wherein the first percentage of electromagnetic radiation is greater than the second percentage of electromagnetic radiation.

18. The mask as claimed in claim 1 wherein the first percentage of electromagnetic radiation is less than the second percentage of electromagnetic radiation.

19. The mask as claimed in claim 1 wherein the electromagnetic radiation sensitive mask material has a contrast ratio between an area of the electromagnetic radiation sensitive mask material not exposed to electromagnetic radiation at the second wavelength and an area of the electromagnetic radiation sensitive mask material exposed to electromagnetic radiation at the second wavelength of less than about 5:1.

20. The mask as claimed in claim 1 wherein the electromagnetic radiation sensitive mask material has a contrast ratio between an area of the electromagnetic radiation sensitive mask material not exposed to electromagnetic radiation at the second wavelength and an area of the electromagnetic radiation sensitive mask material exposed to electromagnetic radiation at the second wavelength of between about 4:1 to about 10:1.

21. The mask as claimed in claim 1 wherein the electromagnetic radiation sensitive mask material has a contrast ratio between an area of the electromagnetic radiation sensitive mask material not exposed to electromagnetic radiation at the second wavelength and an area of the electromagnetic radiation sensitive mask material exposed to electromagnetic radiation at the second wavelength of between about 10:1 to about 25:1.

22. The mask as claimed in claim 1 wherein the electromagnetic radiation sensitive mask material has a contrast ratio between an area of the electromagnetic radiation sensitive mask material not exposed to electromagnetic radiation at the second wavelength and an area of the electromagnetic radiation sensitive mask material exposed to electromagnetic radiation at the second wavelength of between about 25:1 to about 100:1.

23. The mask as claimed in claim 1 wherein the electromagnetic radiation sensitive mask material is deformable.

24. The mask as claimed in claim 23 wherein the electromagnetic radiation sensitive mask material can deform by about 30 percent to about 100 percent.

25. The mask as claimed in claim 23 wherein the electromagnetic radiation sensitive mask material can deform by about 100 percent to about 500 percent.

26. The mask as claimed in claim 24 wherein the electromagnetic radiation sensitive mask material can deform at a temperature of less than about 50° C.

27. The mask as claimed in claim 1 wherein the electromagnetic radiation sensitive mask material is between about 1 µm to about 200 µm thick.

28. A method, comprising:
exposing at least one selected portion of a mask comprising an electromagnetic radiation sensitive mask material having at least one electromagnetic radiation sensitive portion to electromagnetic radiation at a patterning wavelength to cause a reaction of the at least one electromagnetic radiation sensitive portion such that a pattern is formed in the mask; and
subsequently exposing a substrate to electromagnetic radiation at an exposure wavelength through the mask such that the pattern is formed on the substrate, wherein the substrate is sensitive to electromagnetic radiation at the exposure wavelength.

29. The method as claimed in claim 28 wherein the patterning wavelength and the exposure wavelength are the same.

30. The method as claimed in claim 28 wherein the patterning wavelength and the exposure wavelength are different.

31. The method as claimed in claim 28 comprising the step of contacting a substrate with the mask prior to the step of subsequently exposing a substrate.

32. The method as claimed in claim 31 wherein the step of contacting a substrate comprises contacting a non-planar substrate with the mask and deforming the mask to conform to the non-planar substrate.

33. The method as claimed in claim 32 wherein the step of contacting a substrate further comprises heating said mask prior to deforming the mask to conform to the non-planar substrate.

34. The method as claimed in claim 28 wherein the step of exposing comprises exposing the substrate to electromagnetic radiation at a wavelength of about 365-400 nm.

35. The method as claimed in claim 28 further comprising the step of exposing one or more additional substrates to electromagnetic radiation at an exposure wavelength through the mask after the step of subsequently exposing a substrate.

36. A composition for producing a mask, comprising:
a polymer; and
at least one electromagnetic radiation sensitive additive, wherein upon processing of the polymer an electromagnetic radiation sensitive mask material is formed, and wherein the electromagnetic radiation sensitive mask material transmits a smaller percentage of electromagnetic radiation at a first wavelength after exposure of the electromagnetic radiation sensitive mask material to electromagnetic radiation at a second wavelength than the electromagnetic radiation sensitive mask material transmits at the first wavelength prior to exposure of the electromagnetic radiation sensitive additive to electromagnetic radiation at the second wavelength.

37. The composition as claimed in claim 36 wherein the polymer comprises an uncured polymer and the processing comprises curing the uncured polymer.

38. The composition as claimed in claim 36 wherein the polymer comprises a thermoplastic polymer.

39. The composition as claimed in claim 36 wherein the polymer comprises a soluble polymer in a solvent and the processing comprises evaporating the solvent.

40. The composition as claimed in claim 36 wherein the at least one electromagnetic radiation sensitive additive is disposed on the processed polymer.

41. The composition as claimed in claim 36 wherein the at least one electromagnetic radiation sensitive additive is dispersed in the processed polymer.

42. The composition as claimed in claim 36 wherein the at least one electromagnetic radiation sensitive additive is selected from compounds that undergo a photo elimination reaction, a photo rearrangement reaction, a photo oxidation reaction, and a photo-fries product generation reaction.

43. The composition as claimed in claim 36 wherein the at least one electromagnetic radiation sensitive additive comprises a leuco dye.

44. The composition as claimed in claim 43 wherein the at least one electromagnetic radiation sensitive additive further comprises a photo acid generator.

45. The composition as claimed in claim 36 wherein the at least one electromagnetic radiation sensitive additive comprises a compound selected from aromatic esters, including but not limited to, bisphenol acetate and catechol diacetate, fluoran derivatives, triarylmethane derivatives, phenolic derivatives, aromatic isocyanate urethane derivatives, urea derivatives, and carbamate derivatives.

46. The composition as claimed in claim 36 wherein the polymer comprises an uncured polymer that produces an electromagnetic radiation transparent polymer matrix upon curing.

47. The composition as claimed in claim 46 wherein the polymer comprises a styrene and ethylene/butylene block copolymer.

48. The composition as claimed in claim 46 wherein the polymer comprises an isoprene polymer or copolymer.

49. The composition as claimed in claim 47 wherein the polymer further comprises maleic anhydride.

50. The composition as claimed in claim 46 wherein the polymer comprises an aliphatic polyurethane.

51. The composition as claimed in claim 41 wherein the polymer comprises a vinyl chloride polymer or copolymer.

52. A composition for producing a mask, comprising:
at least one electromagnetic sensitive polymer; and
at least one acid sensitive additive, wherein upon processing of the polymer an electromagnetic radiation sensitive mask material is formed, and wherein the electromagnetic radiation sensitive mask material transmits a smaller percentage of electromagnetic radiation at a first wavelength after exposure of the electromagnetic radiation sensitive mask material to electromagnetic radiation at a second wavelength than the electromagnetic radiation sensitive mask material transmits at the first wavelength prior to exposure of the electromagnetic radiation sensitive compound to electromagnetic radiation at the second wavelength.

53. A system, comprising:
a source for a first and a second electromagnetic radiation;
a mask sensitive to the second electromagnetic radiation;
a substrate sensitive to the first electromagnetic radiation; and
a device in conjunction with the source for the first and second electromagnetic radiations, wherein the device is capable of exposing the mask to the second electromagnetic radiation such that regions that are selectively opaque to the first electromagnetic radiation are formed in the mask, and wherein the device is capable of subsequently exposing the substrate to the first electromagnetic radiation through the selectively opaque mask such that portions of the substrate are selectively exposed to the first electromagnetic radiation.

54. The system as claimed in claim 53 wherein at least one additional substrate is exposed to the first electromagnetic radiation through the selectively opaque mask subsequent to the exposure of the substrate sensitive to the first electromagnetic radiation.

* * * * *